US012616040B2

(12) United States Patent (10) Patent No.: US 12,616,040 B2

Umeno et al. (45) Date of Patent: Apr. 28, 2026

(54) METAL LAYER PLATED TO INNER LEADS OF A LEADFRAME

(71) Applicant: ROHM CO., LTD., Kyoto (JP)

(72) Inventors: Ryohei Umeno, Kyoto (JP); Taro Nishioka, Kyoto (JP); Hiroaki Matsubara, Kyoto (JP); Yoshizo Osumi, Kyoto (JP); Tomohira Kikuchi, Kyoto (JP); Moe Yamaguchi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 369 days.

(21) Appl. No.: 18/340,346

(22) Filed: Jun. 23, 2023

(65) Prior Publication Data

US 2023/0335529 A1     Oct. 19, 2023

Related U.S. Application Data

(63) Continuation of application No. PCT/JP2021/044451, filed on Dec. 3, 2021.

(30) Foreign Application Priority Data

Dec. 25, 2020     (JP) ................................ 2020-216413

(51) Int. Cl.
    *H01L 23/00*         (2006.01)
    *H01L 23/31*         (2006.01)
        (Continued)

(52) U.S. Cl.
    CPC ........ *H10W 70/465* (2026.01); *H10W 70/411* (2026.01); *H10W 70/421* (2026.01);
        (Continued)

(58) Field of Classification Search
    CPC ......... H01L 24/48; H01L 24/73; H01L 24/32; H01L 24/49; H01L 24/46; H01L 23/4952;
        (Continued)

(56) References Cited

U.S. PATENT DOCUMENTS 9,831,161 B2 * 11/2017 Matsubara .............. H01L 24/85
2016/0307854 A1 * 10/2016 Matsubara .............. H01L 24/45

FOREIGN PATENT DOCUMENTS

JP         9-82870         3/1997
JP      2004-281510       10/2004
        (Continued)

OTHER PUBLICATIONS

Office Action issued in corresponding German Patent Application Serial No. 11 2021 006 144.5, Oct. 12, 2023, 14 pages w/translation.
        (Continued)

*Primary Examiner* — Alonzo Chambliss

(74) *Attorney, Agent, or Firm* — HSML P.C.

(57)         ABSTRACT

A semiconductor device includes: a semiconductor element; an island lead on which the semiconductor element is mounted; a terminal lead electrically connected to the semiconductor element; a wire connected to the semiconductor element and the terminal lead; and a sealing resin covering the semiconductor element, the island lead, the terminal lead, and the wire. The terminal lead includes a base member having an obverse surface facing in a thickness direction of the terminal lead, and a metal layer located between the obverse surface and the wire. The base member has a greater bonding strength with respect to the sealing resin than the metal layer. The obverse surface includes an opposing side facing the island lead. The obverse surface includes a first portion that includes at least a portion of the opposing side and that is exposed from the metal layer.

16 Claims, 17 Drawing Sheets

(51) Int. Cl.

| | | |
|---|---|---|
| H01L 23/495 | (2006.01) | |
| H10W 70/40 | (2026.01) | |
| H10W 72/30 | (2026.01) | |
| H10W 72/50 | (2026.01) | |
| H10W 74/10 | (2026.01) | |
| H10W 90/00 | (2026.01) | |
| *H10W 72/00* | (2026.01) | |
| *H10W 74/00* | (2026.01) | |

(52) U.S. Cl.
CPC ....... *H10W 70/457* (2026.01); *H10W 70/481* (2026.01); *H10W 72/30* (2026.01); *H10W 72/50* (2026.01); *H10W 74/111* (2026.01); *H10W 90/811* (2026.01); *H10W 72/884* (2026.01); *H10W 74/00* (2026.01); *H10W 90/736* (2026.01); *H10W 90/753* (2026.01)

(58) Field of Classification Search
CPC ........... H01L 23/3107; H01L 23/49562; H01L 23/49541; H01L 23/49503; H01L 23/49582; H01L 2924/181; H01L 24/33; H01L 23/49575; H01L 2224/32245; H01L 2224/73265
See application file for complete search history.

(56) References Cited

FOREIGN PATENT DOCUMENTS

| | | |
|---|---|---|
| JP | 2014-030049 | 2/2014 |
| JP | 2015/100334 | 7/2015 |
| JP | 2015-153987 | 8/2015 |
| JP | 2020-167428 | 10/2020 |

OTHER PUBLICATIONS

International Search Report issued in International Application No. PCT/JP2021/044451, Feb. 15, 2022, 2 pages.
Office Action issued in corresponding Japanese Patent Application No. 2022-572061, Jul. 15, 2025, 8 pages w/ translation.
Office Action issued in corresponding German Patent Application Serial No. 11 2021 006 144.5, Jul. 8, 2024, with machine translation (6 pages).

* cited by examiner

METAL LAYER PLATED TO INNER LEADS OF A LEADFRAME

TECHNICAL FIELD

The present disclosure relates to a semiconductor device that includes a terminal lead electrically connected to a semiconductor element, and a sealing resin covering the terminal lead.

BACKGROUND ART

An example of a conventional semiconductor device is disclosed in Patent Document 1. The semiconductor device includes an inner lead electrically connected to a semiconductor chip, a wire connected to the semiconductor chip and the inner lead, and a sealing member covering the semiconductor chip, the inner lead, and the wire. The sealing member is made of a material containing a synthetic resin. The semiconductor device further includes an outer lead connected to the inner lead and exposed from the sealing member.

In the semiconductor device disclosed in JP-A-2014-30049, a metal layer may be formed on a surface of the inner lead. This mitigates a thermal shock acting on the inner lead when the wire is connected to the inner lead. However, the bonding strength between the metal layer and the sealing member is weaker than the bonding strength between the inner lead and the sealing member. Accordingly, when a tensile force acts on the outer lead in a direction in which the inner lead is pulled out from the sealing member, peeling may occur at the interface between the metal layer and the sealing member. The peeling is more likely to occur when the surface area of the inner lead is relatively small. The peeling causes a defect such as an increase in leakage current in the semiconductor device. Thus, there is a demand for measures to suppress such peeling.

DETAILED DESCRIPTION OF EMBODIMENTS

Embodiments of the present disclosure will be described with reference to the accompanying drawings.

Figure 1:
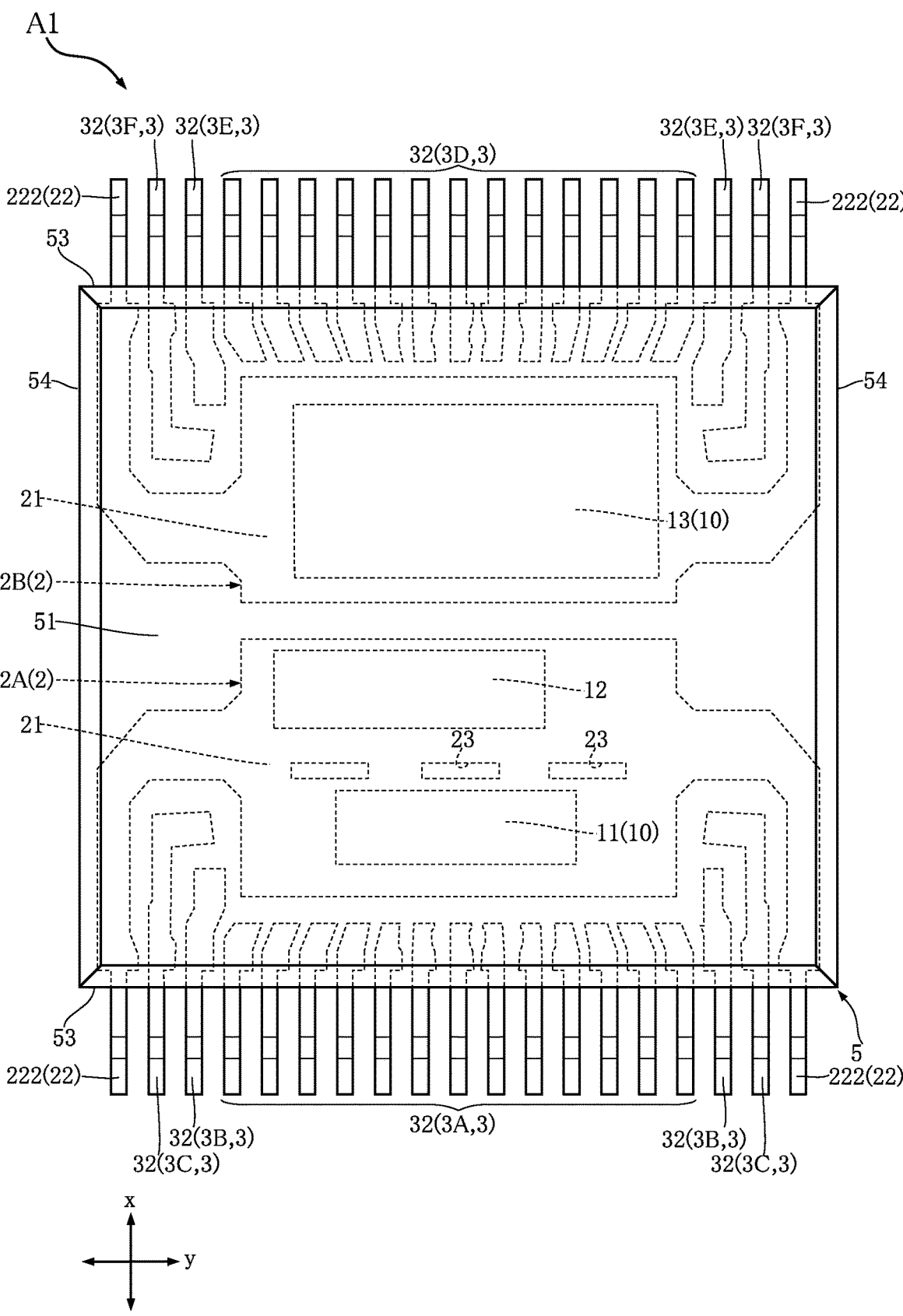
FIG. 1 is a plan view illustrating a semiconductor device according to a first embodiment of the present disclosure.
Figure 2:
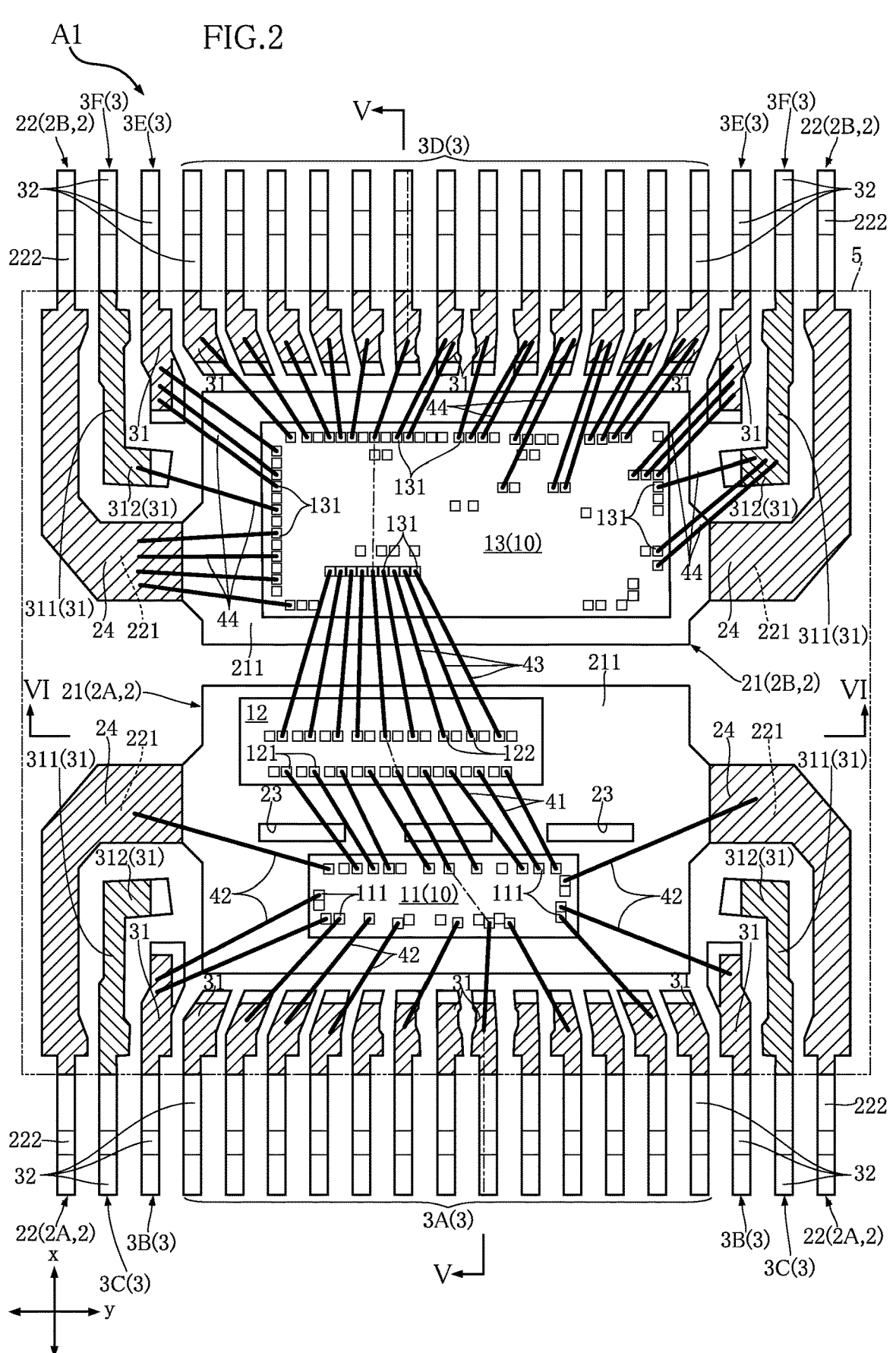
FIG. 2 is a plan view corresponding to FIG. 1, as seen through a sealing resin.

The following describes a semiconductor device A1 according to a first embodiment of the present disclosure, with reference to FIGS. 1 to 12. The semiconductor device A1 includes two semiconductor elements 10, an insulating element 12, two island leads 2, a plurality of terminal leads 3, a plurality of first wires 41, a plurality of second wires 42, a plurality of third wires 43, a plurality of fourth wires 44, and a sealing resin 5. The semiconductor device A1 is surface-mounted on the wiring board of an inverter for an electric vehicle or a hybrid vehicle, for example. The semiconductor device A1 is in a small outline package (SOP). Note that the package type of the semiconductor device A1 is not limited to an SOP. In FIG. 2, the sealing resin 5 is shown in phantom for convenience of understanding, and is indicated by an imaginary line (two-dot chain line).

In the description of the semiconductor device A1, three mutually perpendicular directions, i.e., direction x, direction y, and direction z, will be referenced as appropriate. Furthermore, in the following description, the thickness direction of each of the terminal leads 3 is referred to as "thickness direction z", and the direction x is referred to as "first direction x" and the direction y as "second direction y". However, the present disclosure is not limited to this.

The two semiconductor elements 10 and the insulating element 12 form the functional core of the semiconductor device A1. As shown in FIG. 2, the two semiconductor elements 10 include a first semiconductor element 11 and a second semiconductor element 13. In the semiconductor device A1, each of the first semiconductor element 11, the second semiconductor element 13, and the insulating element 12 is an individual element. As viewed in the thickness direction z, each of the first semiconductor element 11, the second semiconductor element 13, and the insulating element 12 has a rectangular shape with its longer sides extending in the second direction y.

The first semiconductor element 11 is the controller (control element) of a gate driver for driving a switching element such as an IGBT or a MOSFET. The first semiconductor element 11 has a circuit that converts a control signal inputted from, for example, an ECU into a PWM control signal, a transmission circuit that transmits the PWM control signal to the second semiconductor element 13, and a reception circuit that receives an electric signal from the second semiconductor element 13.

The second semiconductor element 13 is a gate driver (drive element) for driving the switching element. The second semiconductor element 13 has a reception circuit that receives a PWM control signal, a circuit that drives the switching element based on the PWM control signal, and a transmission circuit that transmits an electric signal to the first semiconductor element 11. The electric signal may be an output signal from a temperature sensor located near a motor.

The insulating element 12 transmits a PWM control signal or other electric signals in an electrically insulated state. In the semiconductor device A1, the insulating element 12 is of an inductive type. An example of the inductive insulating element 12 is an insulating transformer. The insulating transformer transmits an electric signal in an electrically insulated state by inductively coupling two inductors (coils). The insulating element 12 has a silicon substrate. Inductors made of copper are mounted on the substrate. The inductors include a transmission inductor and a reception inductor, which are stacked in the thickness direction z. A dielectric layer made of, for example, silicon dioxide ($SiO_2$) is provided between the transmission inductor and the reception inductor. The dielectric layer electrically insulates the transmission inductor from the reception inductor. Alternatively, the insulating element 12 may be of a capacitive type. An example of the capacitive insulating element 12 is a capacitor. Alternatively, the insulating element 12 may be a photocoupler.

In the semiconductor device A1, the second semiconductor element 13 requires a higher source voltage than the first semiconductor element 11. As a result, a high potential difference is created between the first semiconductor element 11 and the second semiconductor element 13. Accordingly, in the semiconductor device A1, a first circuit including the first semiconductor element 11 as a component and a second circuit including the second semiconductor element 13 as a component are insulated from each other by the insulating element 12. The first circuit has a different potential from the second circuit. In the semiconductor device A1, the second circuit has a higher potential than the first circuit. As such, the insulating element 12 relays a mutual signal between the first circuit and the second circuit. In the case of an inverter for an electric vehicle or a hybrid vehicle, the voltage applied to the ground of the first semiconductor element 11 is approximately 0 V, whereas the voltage applied to the ground of the second semiconductor element 13 becomes 600 V or higher transiently.

Figure 5:
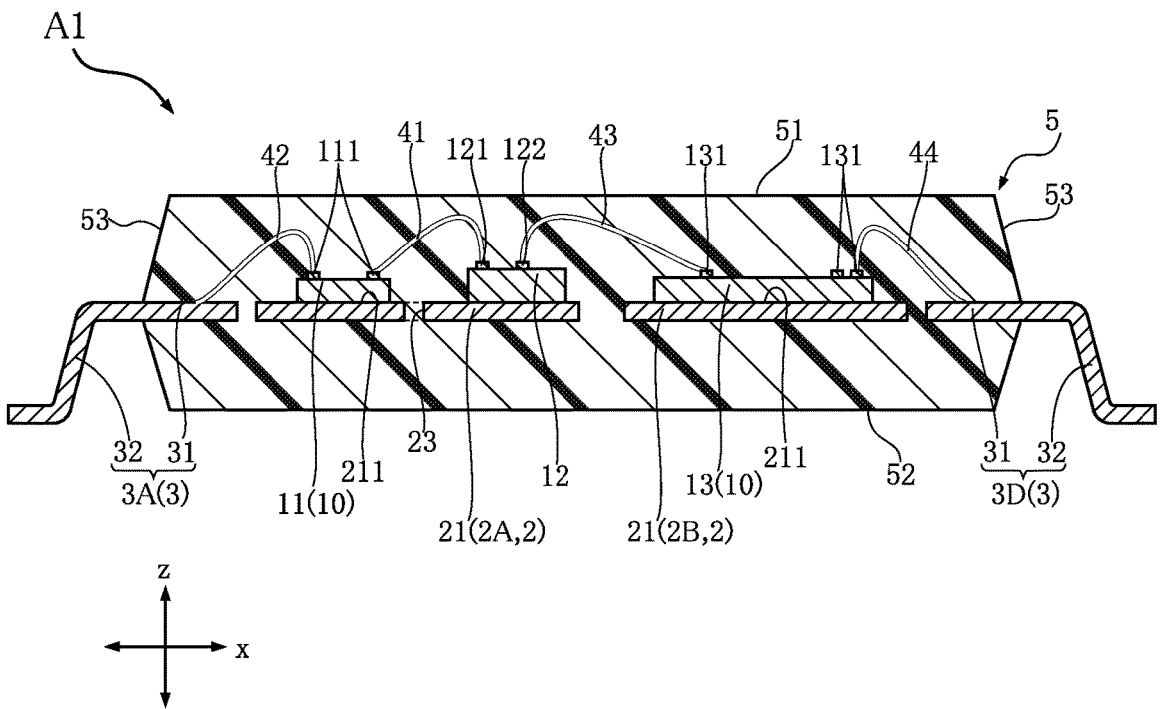
FIG. 5 is a cross-sectional view taken along line V-V in FIG. 2.
Figure 6:
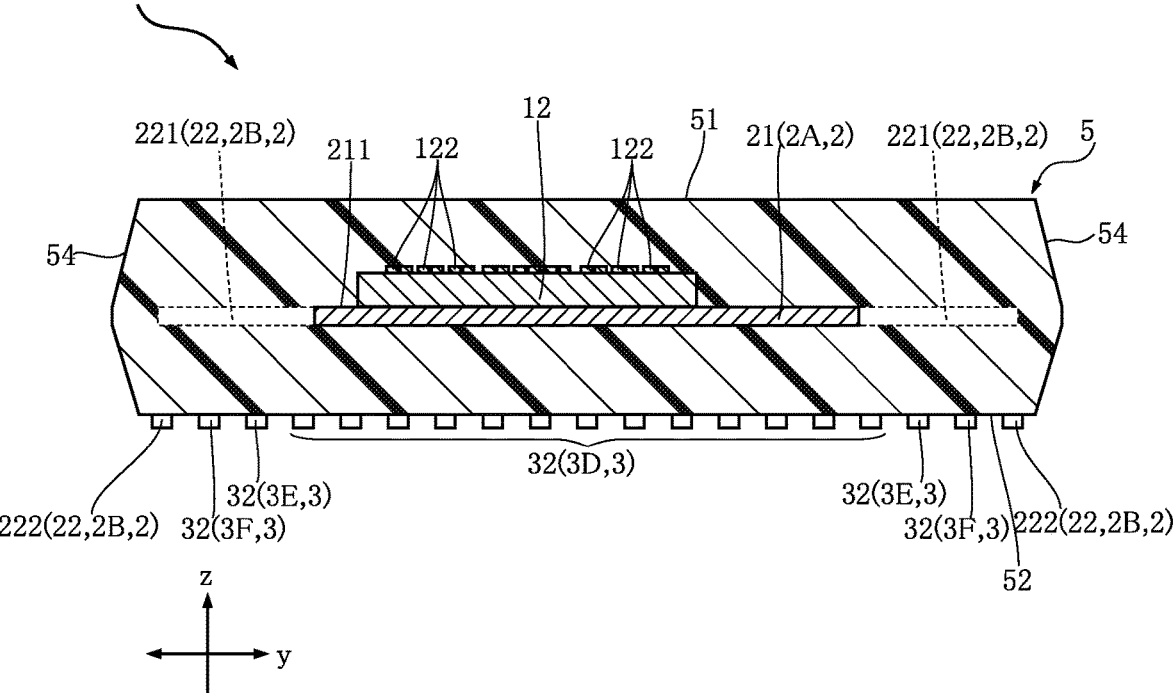
FIG. 6 is a cross-sectional view taken along line VI-VI in FIG. 2.

As shown in FIGS. 2 and 5, a plurality of electrodes 111 are provided on an upper surface of the first semiconductor element 11 (i.e., a surface facing in the same direction as mounting surfaces 211 of island portions 21 of the two island leads 2 described below). The electrodes 111 are electrically connected to a circuit configured in the first semiconductor element 11. Similarly, a plurality of electrodes 131 are provided on an upper surface of the second semiconductor element 13 (i.e., a surface facing in the same direction as the mounting surfaces 211). The electrodes 131 are electrically connected to a circuit configured in the second semiconductor element 13.

As shown in FIGS. 2 and 5, the insulating element 12 is positioned between the first semiconductor element 11 and the second semiconductor element 13 in the first direction x. A plurality of first electrodes 121 and a plurality of second electrodes 122 are provided on an upper surface of the insulating element 12 (i.e., a surface facing in the same direction as the mounting surfaces 211 described above). Each of the first electrodes 121 and the second electrodes 122 is electrically connected to either the transmission inductor or the reception inductor. The first electrodes 121 are aligned in the second direction y, and located closer to the first semiconductor element 11 than to the second semiconductor element 13 in the first direction x. The second electrodes 122 are aligned in the second direction y, and are located closer to the second semiconductor element 13 than to the first semiconductor element 11 in the first direction x.

The two island leads 2 and the terminal leads 3 are conductive members that form a conductive path between the wiring board on which the semiconductor device A1 is mounted and each of the two semiconductor elements 10 and the insulating element 12. These main components are formed from the same lead frame. The composition of the lead frame includes copper (Cu). In other words, the lead frame contains copper.

As shown in FIGS. 1 and 2, the two island leads 2 are spaced apart from each other in the first direction x. The two island leads 2 include a first island 2A and a second island 2B. The first island 2A is located in a first sense of the first direction x. The second island 2B is located in a second sense of the first direction x. In the semiconductor device A1, the first semiconductor element 11 and the insulating element 12 are mounted on the first island 2A, and the second semiconductor element 13 is mounted on the second island 2B.

As shown in FIG. 2, each of the two island leads 2 has an island portion 21 and two lead portions 22. At least one of the two semiconductor elements 10 and the insulating element 12 is mounted on the island portion 21. The island portion 21 is covered with the sealing resin 5. The island portion 21 has a mounting surface 211 facing in the thickness direction z. The first semiconductor element 11 and the insulating element 12 are mounted on the mounting surface 211 of the island portion 21 of the first island 2A. The second semiconductor element 13 is mounted on the mounting surface 211 of the island portion 21 of the second island 2B. Each of the two semiconductor elements 10 and the insulating element 12 is bonded to either the mounting surface 211 of the first island 2A or the mounting surface 211 of the second island 2B via a non-illustrated conductive bonding member (e.g., solder or metal paste). The island portion 21 has a thickness of about 100 μm to 300 μm, for example.

As shown in FIGS. 2 and 5, the island portion 21 of the first island 2A is formed with a plurality of through holes 23. Each of the through holes 23 penetrates through the island portion 21 and extends along the second direction y. As viewed in the thickness direction z, at least one of the through holes 23 is positioned between the first semiconductor element 11 and insulating element 12. The through holes 23 are aligned in the second direction y.

As shown in FIG. 2, the two lead portions 22 are connected to both sides of the island portion 21 in the second direction y. The two lead portions 22 are located away from each other in the second direction y. At least one of the two lead portions 22 of the first island 2A is electrically connected to the first semiconductor element 11 via one of the second wires 42. At least one of the two lead portions 22 of the second island 2B is electrically connected to the second semiconductor element 13 via some of the fourth wires 44.

Figure 3:
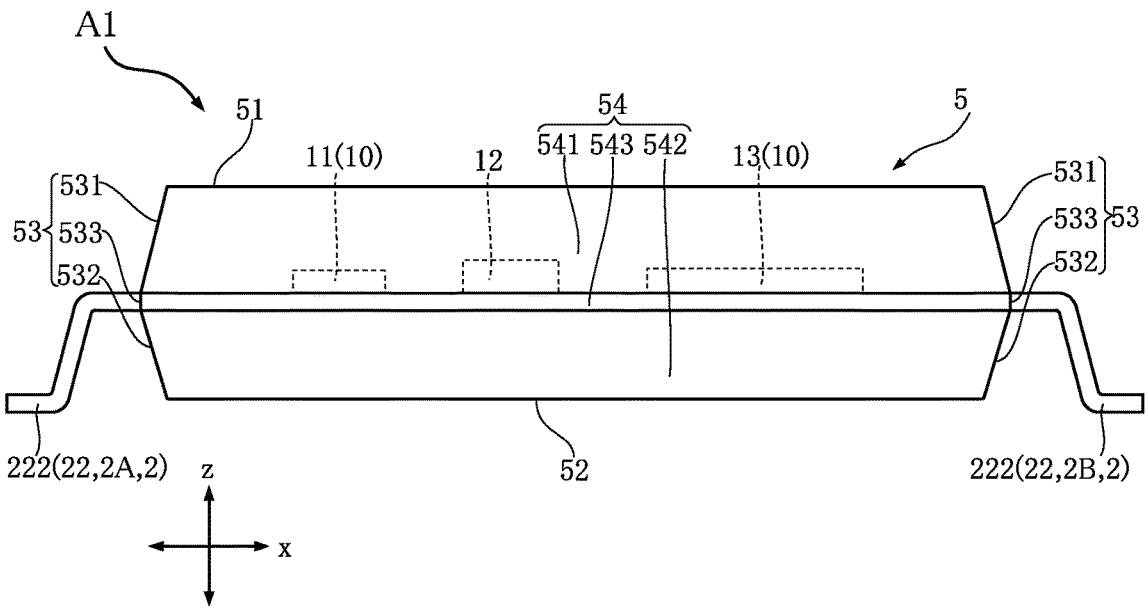
FIG. 3 is a front view illustrating the semiconductor device in FIG. 1.

As shown in FIG. 2, each of the two lead portions 22 has a covered portion 221 and an exposed portion 222. The covered portion 221 is connected to the island portion 21 and covered with the sealing resin 5. A metal layer 24 is provided between a surface of the covered portion 221 in a first sense of the thickness direction z (i.e., a sense of the thickness direction z in which the mounting surface 211 of the island portion 21 faces) and the sealing resin 5. The composition of the metal layer 24 includes silver (Ag). The exposed portion 222 is connected to the covered portion 221 and exposed from the sealing resin 5. As viewed in the thickness direction z, the exposed portion 222 extends in the first direction x. As shown in FIG. 3, the exposed portion 222 is bent into a gull-wing shape as viewed in the second direction y. The surface of the exposed portion 222 may be plated with tin (Sn), for example.

As shown in FIGS. 1 and 2, the terminal leads 3 are located in both senses of the first direction x and aligned in the second direction y. At least one of the terminal leads 3 is electrically connected to one of the two semiconductor elements 10. The terminal leads 3 include a plurality of first terminals 3A, two second terminals 3B, and two third terminals 3C, which are all located in the first sense of the first direction x, and a plurality of fourth terminals 3D, two fifth terminals 3E, and two sixth terminals 3F, which are all located in the second sense of the first direction x.

As shown in FIG. 2, at least one of the first terminals 3A, the two second terminals 3B, and the two third terminals 3C is electrically connected to the first semiconductor element 11 via at least one of the second wires 42. The two second terminals 3B flank the first terminals 3A in the second direction y. Each of the two third terminals 3C is positioned between one of the two lead portions 22 of the first island 2A and the second terminal 3B closest to the lead portion 22 in the second direction y.

As shown in FIG. 2, at least one of the fourth terminals 3D, the two fifth terminals 3E and the two sixth terminals 3F is electrically connected to the second semiconductor element 13 via at least one of the fourth wires 44. The two fifth terminals 3E flank the fourth terminals 3D in the second direction y. Each of the two sixth terminals 3F is positioned between one of the two lead portions 22 of the second island 2B and the fifth terminal 3E closest to the lead portion 22 in the second direction y.

As shown in FIGS. 2 and 5, each of the terminal leads 3 has a covered portion 31 and an exposed portion 32. The covered portion 31 is covered with the sealing resin 5. One of the second wires 42 and the fourth wires 44 is connected to the covered portion 31 of at least one of the terminal leads 3. The covered portion 31 of each of the two second terminals 3B and the two fifth terminals 3E is larger in dimension than the covered portion 31 of each of the first terminals 3A and the fourth terminals 3D in the first direction x. The exposed portion 32 is connected to the covered portion 31 and exposed from the sealing resin 5. As viewed in the thickness direction z, the exposed portion 32 extends in the first direction x. As viewed in the second direction y, the exposed portion 32 is bent into a gull-wing shape. The exposed portion 32 has the same shape as the exposed portion 222 of each of the two lead portions 22 of the respective island leads 2. The surface of the exposed portion 32 may be plated with tin, for example.

As shown in FIG. 2, the covered portion 31 of each of the two third terminals 3C and the two sixth terminals 3F has a base 311 and an extended portion 312. The base 311 extends from the exposed portion 32 in the first direction x. The base 311 is larger in dimension than the covered portion 31 of each of the two second terminals 3B and the two fifth terminals 3E in the first direction x. The extended portion 312 extends from the base 311 toward the island portion 21 of a corresponding one of the two island leads 2 in the second direction y. Some of the fourth wires 44 are connected to the extended portions 312 of the two sixth terminals 3F.

As shown in FIGS. 7 to 14, each of the terminal leads 3 includes a base member 33 and a metal layer 34. The base member 33 has an obverse surface 331 facing in the thickness direction z. The obverse surface 331 faces in the same direction as the mounting surfaces 211 of the island portions 21 of the two island leads 2. The base member 33 is a portion of the lead frame that forms the main parts of the terminal leads 3. Accordingly, the composition of the base member 33 includes copper. The metal layer 34 is located between the obverse surface 331 and one of the second wires 42 and the fourth wires 44. The metal layer 34 is included in the covered portion 31 of the terminal lead 3. The metal layer 34 is in contact with the sealing resin 5. The composition of the metal layer 34 includes silver. Alternatively, the composition of the metal layer 34 may include at least one of nickel (Ni), palladium (Pd), and gold (Au). The base member 33 has a greater bonding strength with respect to the sealing resin 5 than the metal layer 34. If the composition of the base member 33 includes copper and the composition of the metal layer 34 includes silver, the bonding strength per unit area between the base member 33 and the sealing resin 5 will be about 14 times greater than the bonding strength per unit area between the metal layer 34 and the sealing resin 5.

As shown in FIGS. 7 to 14, the obverse surface 331 of the base member 33 included in each of the terminal leads 3 has an opposing side 332. The opposing side 332 faces the island portion 21 of one of the two island leads 2. In the semiconductor device A1, the opposing side 332 is a straight line. Alternatively, the opposing side 332 may be a curved line. The opposing side 332 has two ends 332A. The obverse surface 331 further includes a first portion 333. The first portion 333 includes at least a portion of the opposing side 332, and is exposed from the metal layer 34. The first portion 333 is in contact with the sealing resin 5. In the semiconductor device A1, the first portion 333 includes the entirety of the opposing side 332.

Each of the terminal leads 3 satisfies the following requirements. As viewed in the thickness direction z, the distance d (see FIGS. 7 to 14) between the metal layer 34 and the opposing side 332 is 0.03 to 1.0 times the thickness t (see FIGS. 8 and 12) of the base member 33. For example, the distance d is in the range of 10 $\mu$m to 100 $\mu$m. The thickness t is in the range of 100 $\mu$m to 300 $\mu$m, for example. As viewed in the thickness direction z, the distance d is 0.25 to 5.0 times a length L (see FIGS. 7, 9 to 11, 13, and 14) of the opposing side 332. The length L is in the range of 20 $\mu$m to 40 $\mu$m, for example. As viewed in the thickness direction z, the distance d is 0.02 to 0.25 times a distance D (see FIGS. 7 to 14) between the opposing side 332 and the island portion 21 of one of the two island leads 2. The distance D is in the range of 400 $\mu$m to 500 $\mu$m, for example.

Figure 7:
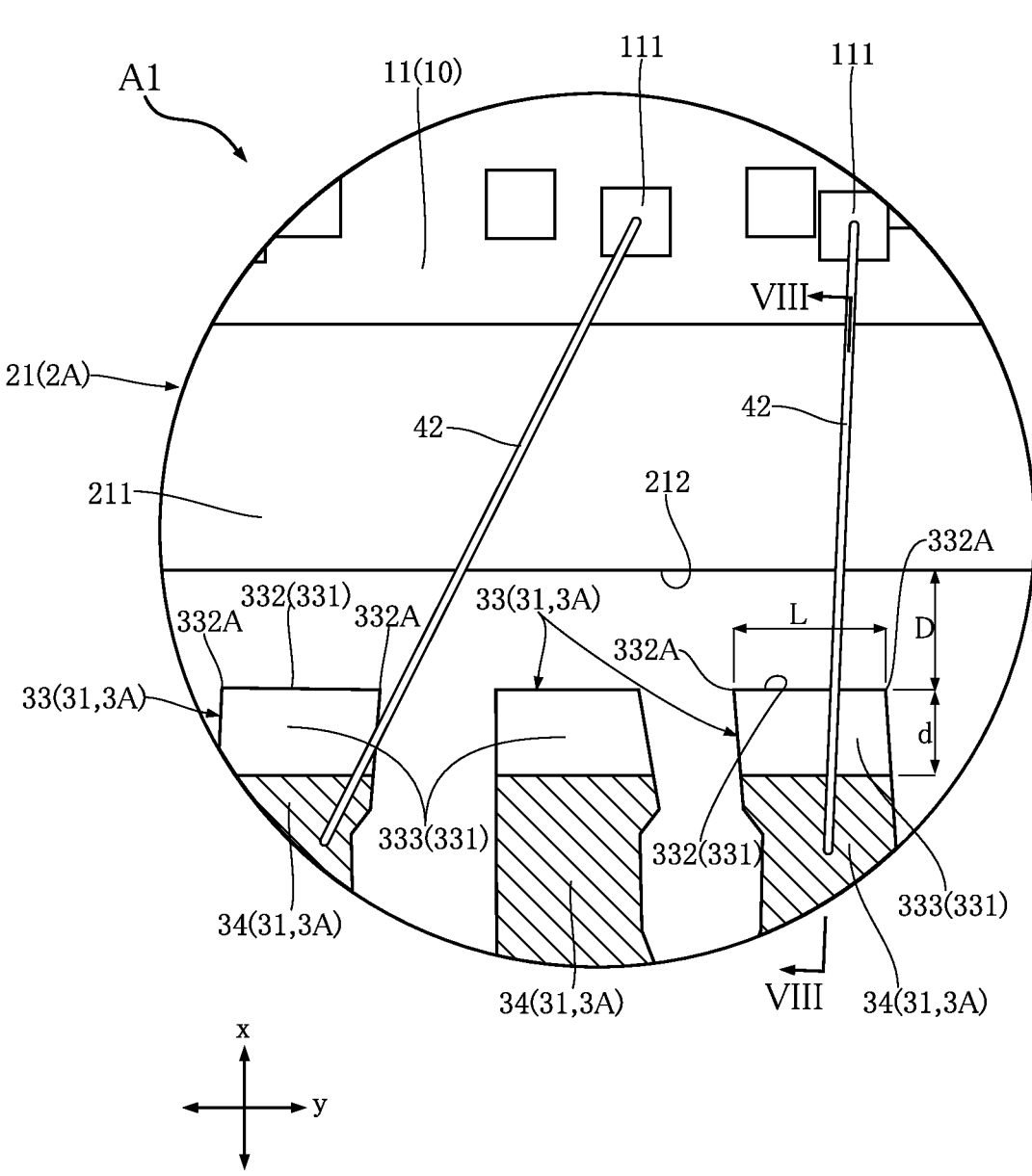
FIG. 7 is a partially enlarged view of FIG. 2.
Figure 8:
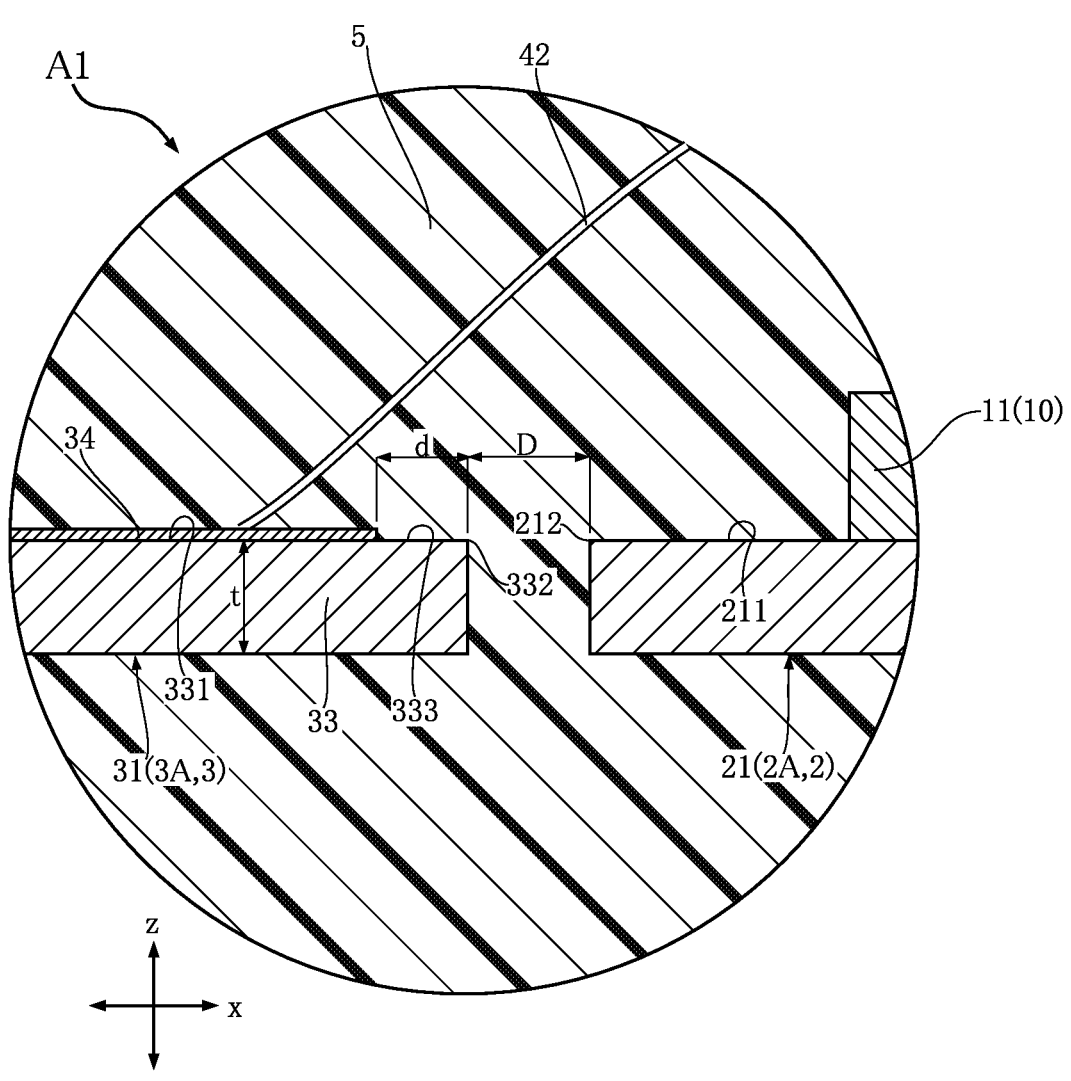
FIG. 8 is a cross-sectional view taken along line VIII-VIII in FIG. 7.
Figure 9:
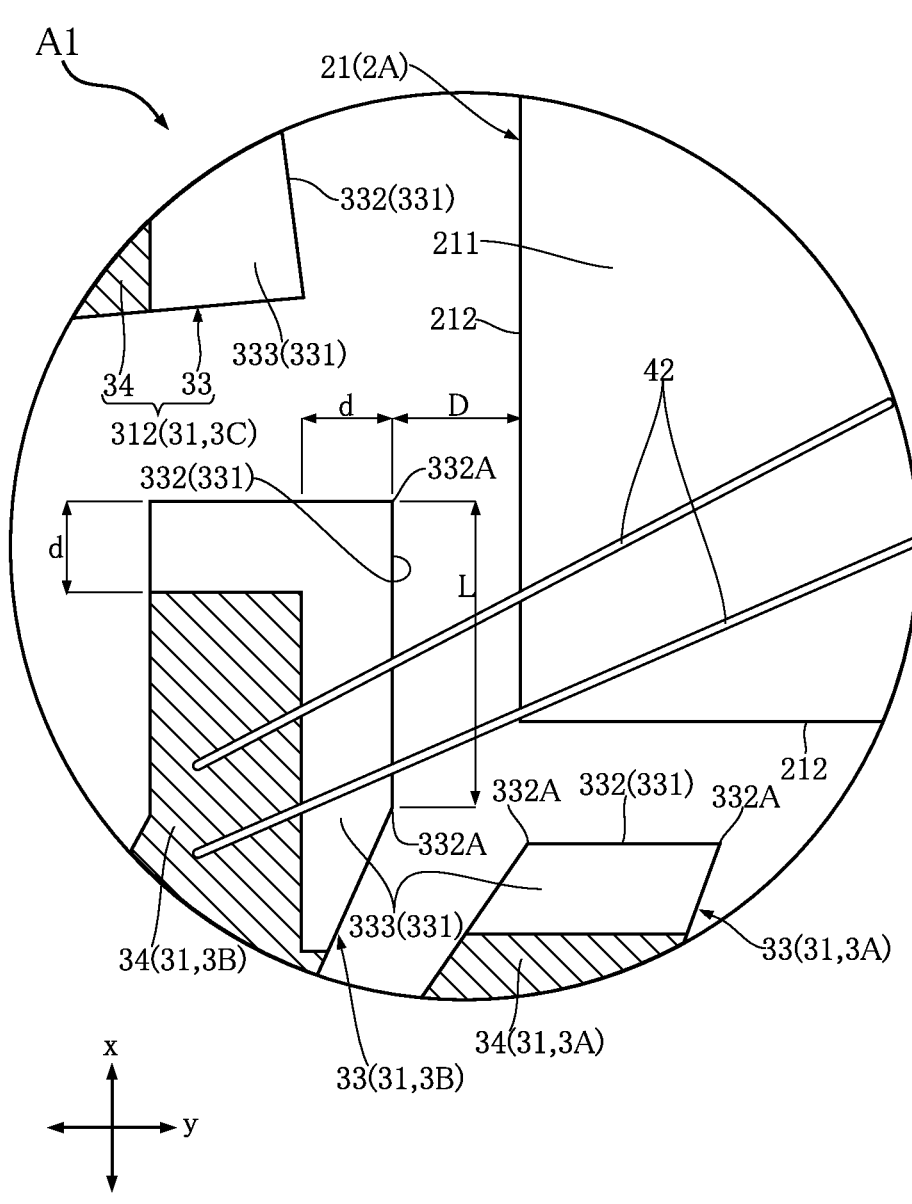
FIG. 9 is a partially enlarged view of FIG. 2.
Figure 10:
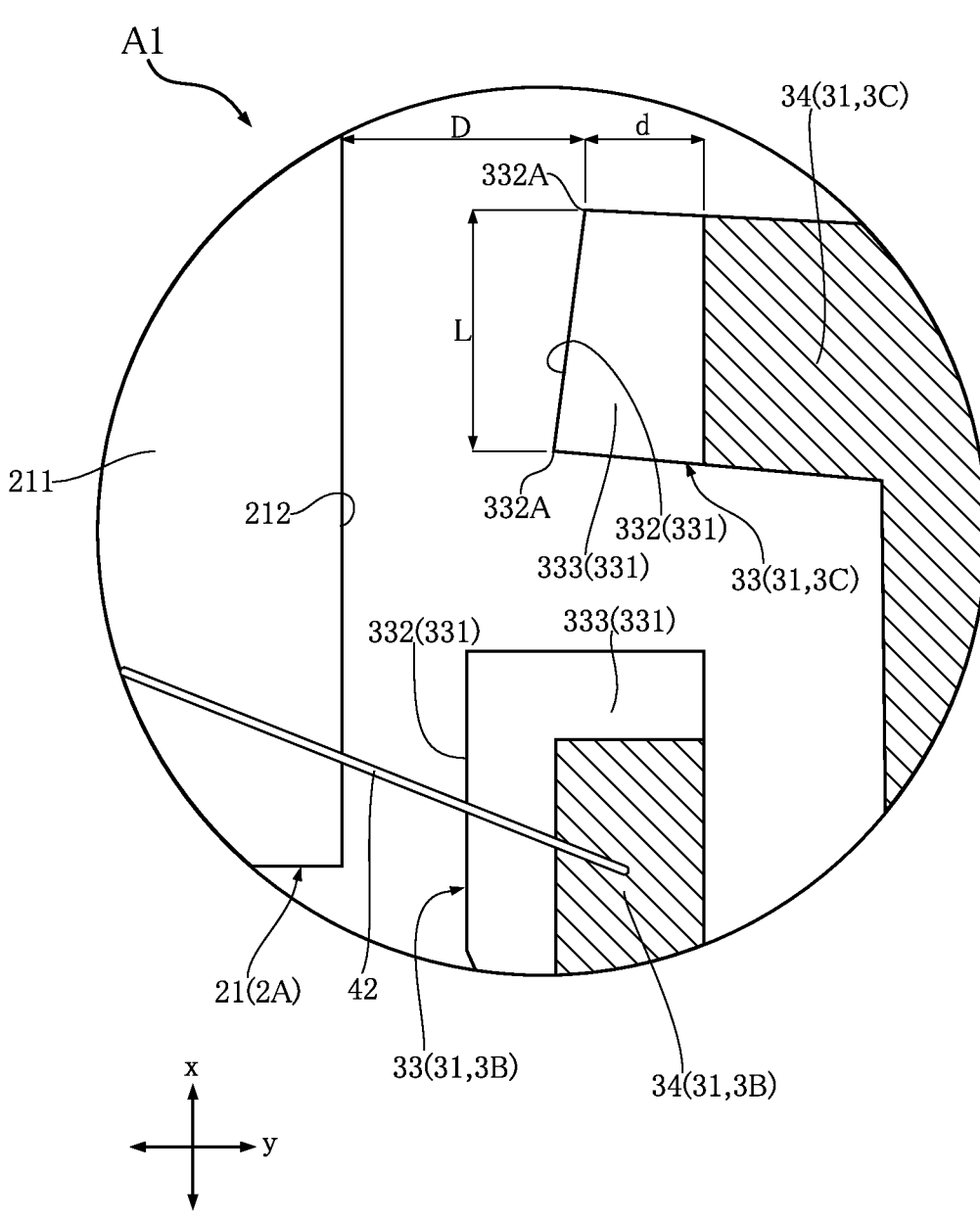
FIG. 10 is a partially enlarged view of FIG. 2.
Figure 11:
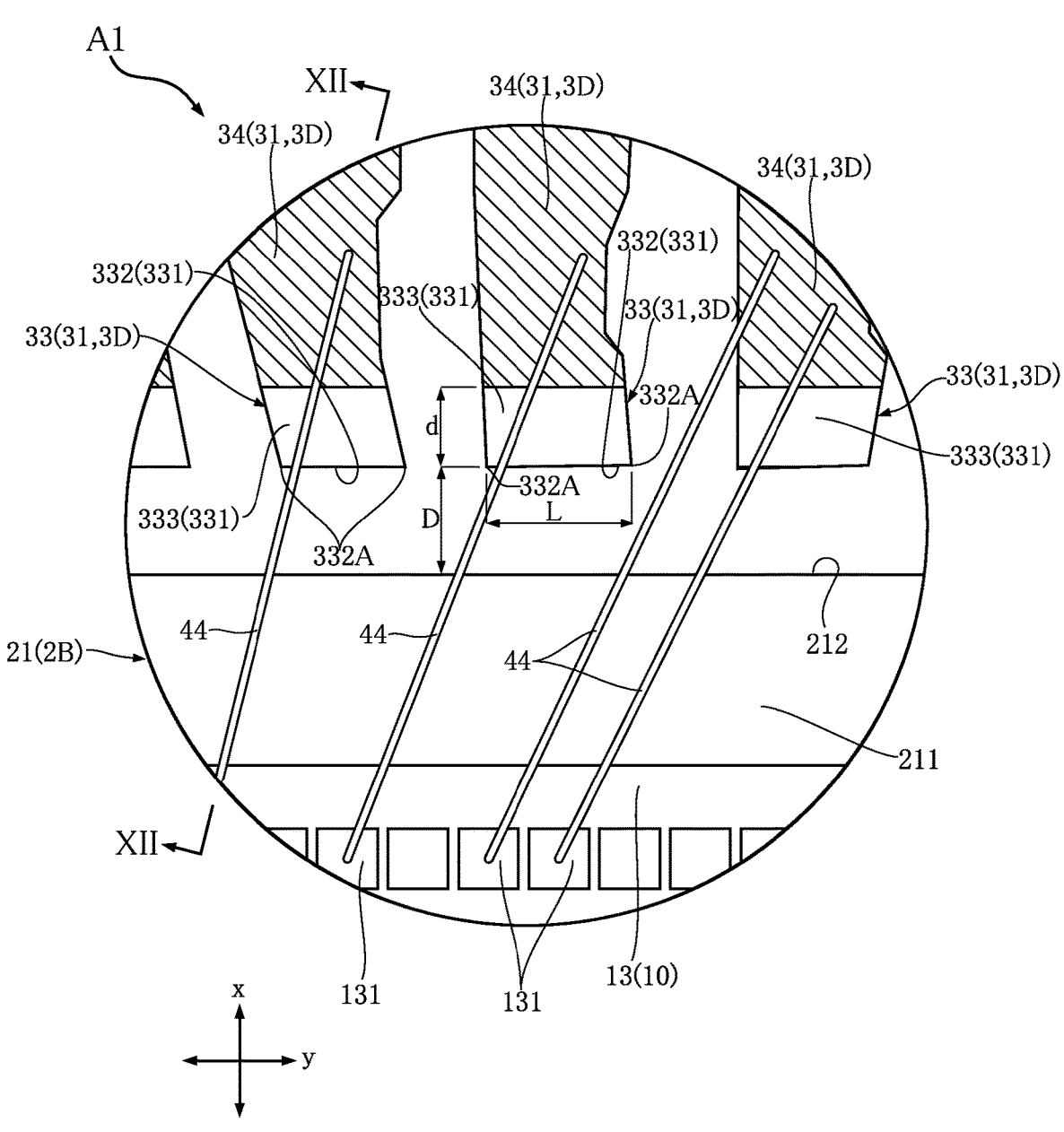
FIG. 11 is a partially enlarged view of FIG. 2.
Figure 12:
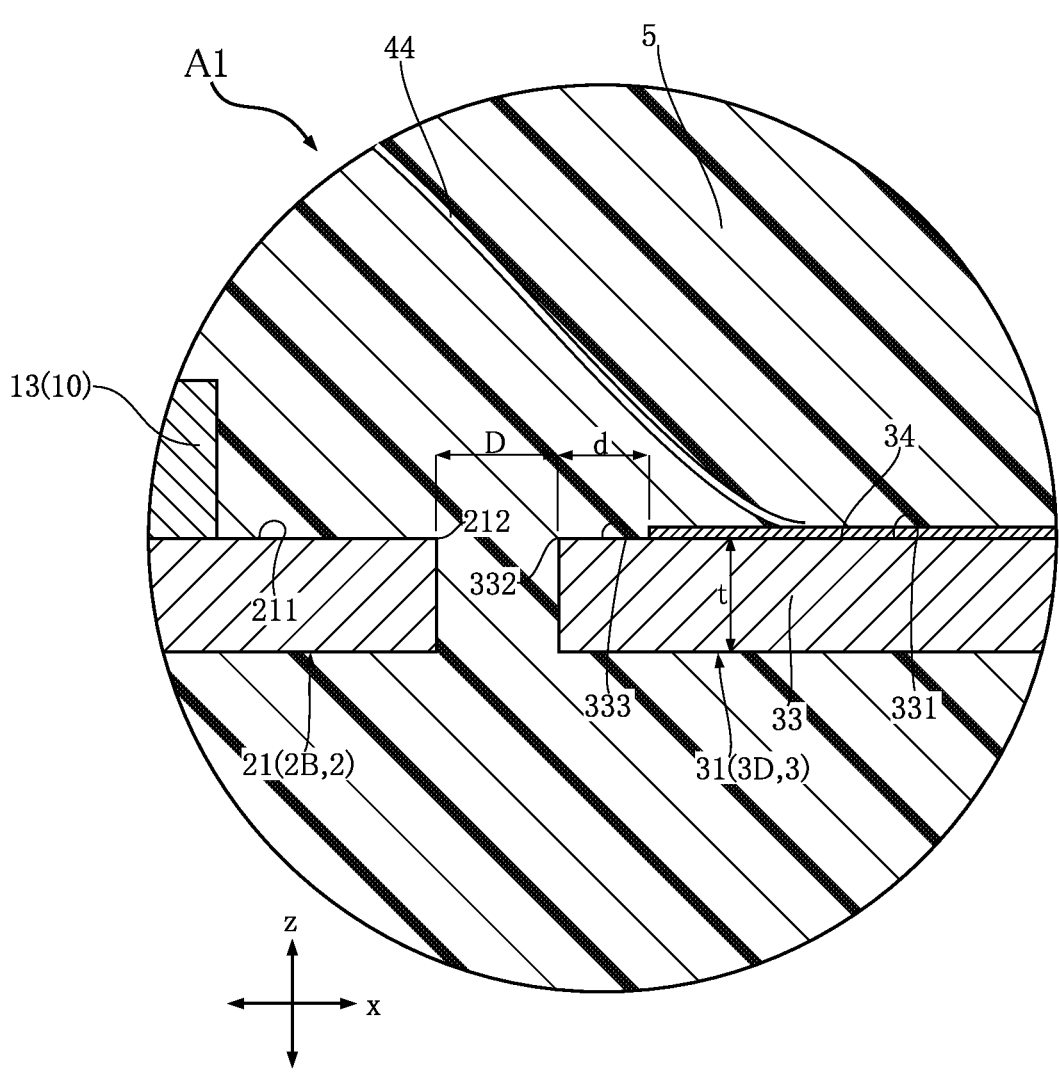
FIG. 12 is a cross-sectional view taken along line XII-XII in FIG. 11.
Figure 13:
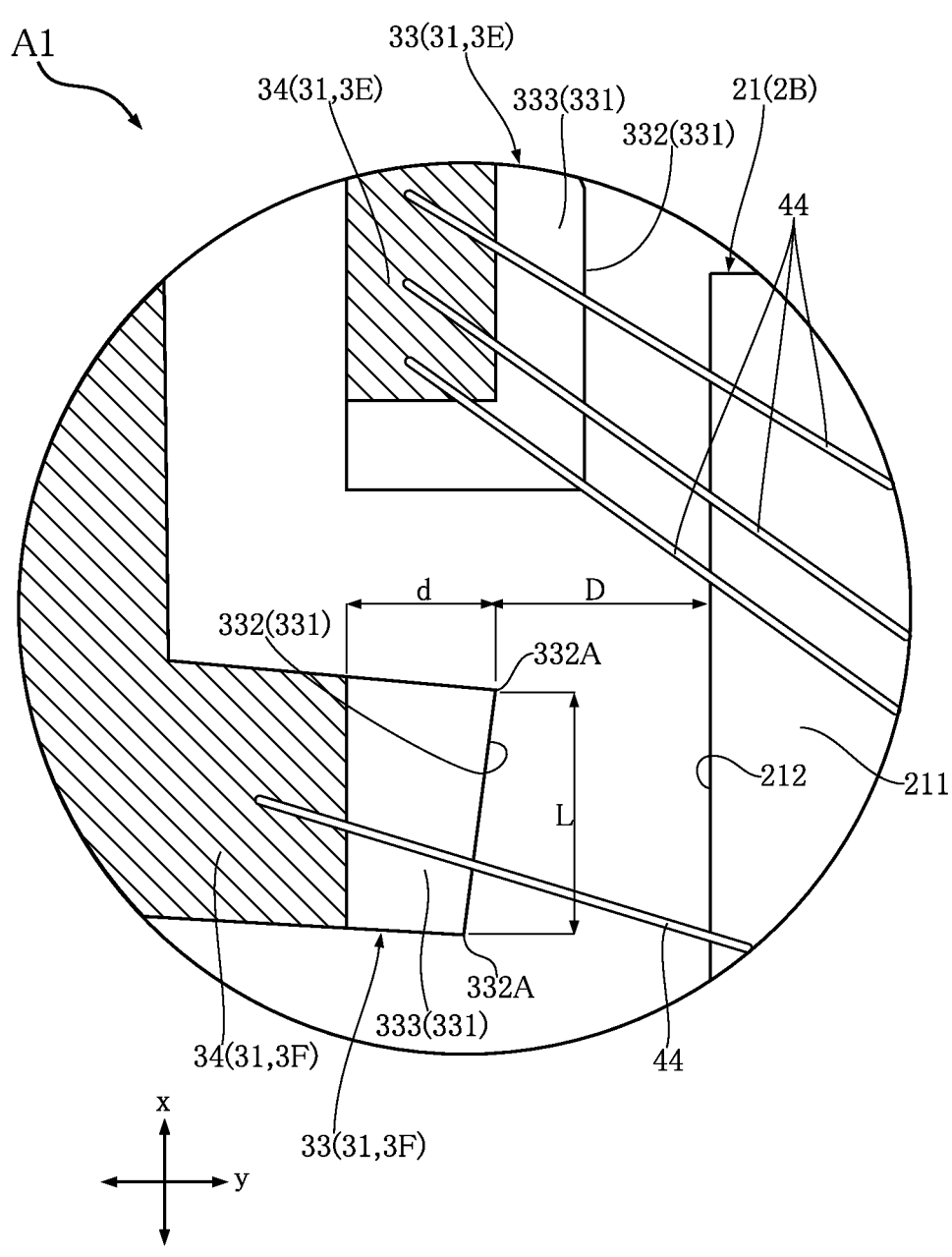
FIG. 13 is a partially enlarged view of FIG. 2.
Figure 14:
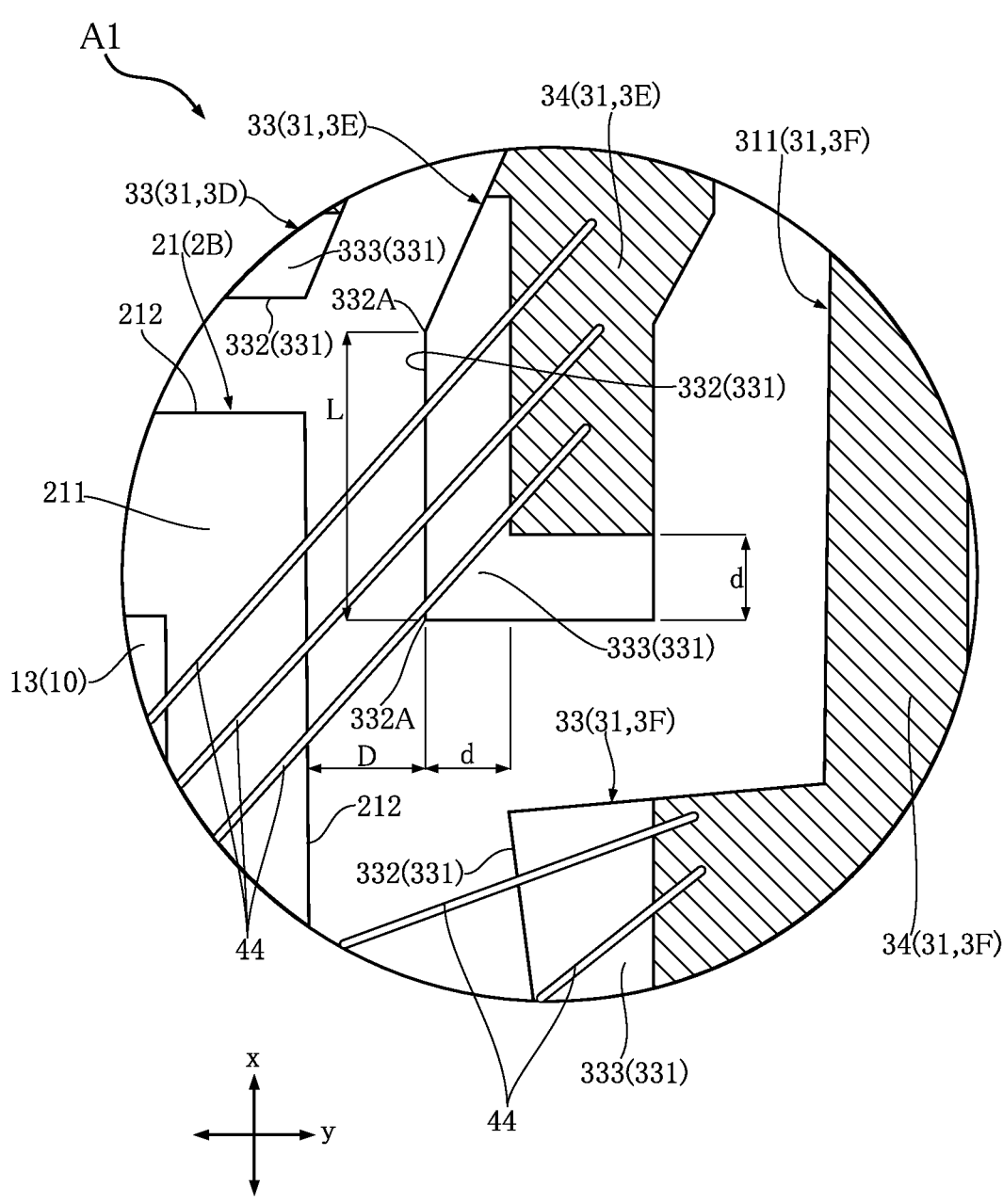
FIG. 14 is a partially enlarged view of FIG. 2.

As shown in FIGS. 7 to 14, the island portion 21 of each of the two island leads 2 has a plurality of first sides 212. The first sides 212 extend in a direction perpendicular to the thickness direction z. In the semiconductor device A1, each of the first sides 212 extend in one of the first direction x and the second direction y. As shown in FIGS. 7 and 11, the first terminals 3A and the fourth terminals 3D face the first sides 212 extending in the second direction y. As shown in FIGS. 9 and 14, the two second terminals 3B and the two fifth terminals 3E face the ends of the first sides 212 extending in the second direction y. As shown in FIGS. 10 and 13, the two third terminals 3C and the two sixth terminals 3F face the first sides 212 extending in the first direction x.

The first wires 41, the second wires 42, the third wires 43, and the fourth wires 44 form a conductive path, together with the two island leads 2 and the terminal leads 3, for the two semiconductor elements 10 and the insulating element 12 to perform predetermined functions. The composition of the first wires 41, the second wires 42, the third wires 43, and the fourth wires 44 includes gold. Alternatively, the composition of these wires may include copper or aluminum (Al).

As shown in FIGS. 2 and 5, each of the first wires 41 is connected to one of the first electrodes 121 of the insulating element 12 and to one of the electrodes 111 of the first semiconductor element 11. As a result, the first semiconductor element 11 and the insulating element 12 are electrically connected to each other. The first wires 41 are aligned in the second direction y.

As shown in FIGS. 2 and 5, each of the second wires 42 is connected to one of the electrodes 111 of the first semiconductor element 11 and to the covered portion 31 of one of the first terminals 3A and the two second terminals 3B. As a result, at least one of the first terminals 3A and the two second terminals 3B is electrically connected to the first semiconductor element 11. Furthermore, at least one of the second wires 42 is connected to one of the electrodes 111 and to the covered portion 221 of one of the two lead portions 22 of the first island 2A. As a result, the first island 2A is electrically connected to the first semiconductor element 11. Each of the second wires 42 is in contact with the metal layer 34 of one of the first terminals 3A and the two second terminals 3B. As shown in FIGS. 7 and 9, at least one of the second wires 42 overlaps with the opposing side 332 of one of the first terminals 3A and the two second terminals 3B. Furthermore, one of the second wires 42 overlaps with the first portion 333 of one of the first terminals 3A and the two second terminals 3B.

As shown in FIGS. 2 and 5, each of the third wires 43 is connected to one of the second electrodes 122 of the insulating element 12 and one of the electrodes 131 of the second semiconductor element 13. As a result, the second semiconductor element 13 and the insulating element 12 are electrically connected to each other. The third wires 43 are aligned in the second direction y. In the semiconductor device A1, the third wires 43 bridge the island portion 21 of the first island 2A and the island portion 21 of the second island 2B.

As shown in FIGS. 2 and 5, each of the fourth wires 44 is connected to one of the electrodes 131 of the second semiconductor element 13 and to the covered portion 31 of one of the fourth terminals 3D, the two fifth terminals 3E, and the two sixth terminals 3F. As a result, at least one of the fourth terminals 3D, the two fifth terminals 3E, and the two sixth terminals 3F is electrically connected to the second semiconductor element 13. Furthermore, at least one of the fourth wires 44 is connected to one of the electrodes 131 and to the covered portion 221 of one of the two lead portions 22 of the second island 2B. As a result, the second island 2B is electrically connected to the second semiconductor element 13. Each of the fourth wires 44 is in contact with the metal layer 34 of one of the fourth terminals 3D, the two fifth terminals 3E, and the two sixth terminals 3F. As shown in FIGS. 10 and 12, at least one of the fourth wires 44 overlaps with the opposing side 332 of one of the fourth terminals 3D and the two fifth terminals 3E. Furthermore, one of the fourth wires 44 overlaps with the first portion 333 of one of the fourth terminals 3D and the two fifth terminals 3E.

As shown in FIG. 1, the sealing resin 5 covers the two semiconductor elements 10, the insulating element 12, and a portion of each of the two island leads 2 and the terminal leads 3. As shown in FIG. 5, the sealing resin 5 further covers the first wires 41, the second wires 42, the third wires 43, and the fourth wires 44. The sealing resin 5 is electrically insulative. The sealing resin 5 insulates the two island leads 2 from each other. The sealing resin 5 is made of a material containing a black epoxy resin, for example. As viewed in the thickness direction z, the sealing resin 5 has a rectangular shape.

Figure 4:
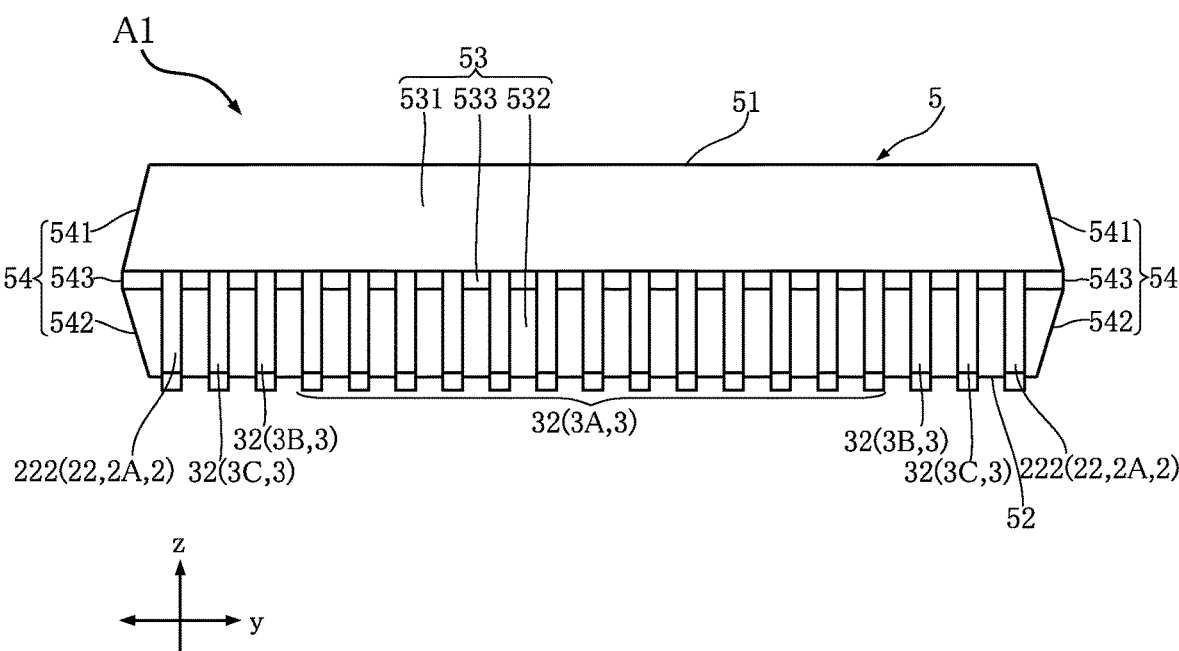
FIG. 4 is a left-side view illustrating the semiconductor device in FIG. 1.

As shown in FIGS. 3 and 4, the sealing resin 5 has a top surface 51, a bottom surface 52, a pair of first side surfaces 53, and a pair of second side surfaces 54.

As shown in FIGS. 3 and 4, the top surface 51 and the bottom surface 52 are spaced apart from each other in the thickness direction z. The top surface 51 and the bottom surface 52 face away from each other in the thickness direction z. Each of the top surface 51 and the bottom surface 52 is flat (or substantially flat).

As shown in FIGS. 3 and 4, the pair of first side surfaces 53 are connected to the top surface 51 and the bottom surface 52, and are spaced apart from each other in the first direction x. The exposed portions 222 of the two lead portions 22 of the first island 2A and the exposed portions 32 of the first terminals 3A, the two second terminals 3B, and the two third terminals 3C are exposed from one of the pair of first side surfaces 53 that is located in the first sense of the first direction x. The exposed portions 222 of the two lead portions 22 of the second island 2B and the exposed portions 32 of the fourth terminals 3D, the two fifth terminals 3E, and the two sixth terminals 3F are exposed from one of the pair of first side surfaces 53 that is located in the second sense of the first direction x.

As shown in FIGS. 3 and 4, each of the pair of first side surfaces 53 includes a first upper portion 531, a first lower portion 532, and a first intermediate portion 533. One end of the first upper portion 531 in the thickness direction z is connected to the top surface 51, and the other end thereof in the thickness direction z is connected to the first intermediate portion 533. The first upper portion 531 is inclined relative to the top surface 51. One end of the first lower portion 532 in the thickness direction z is connected to the bottom surface 52, and the other end thereof in the thickness direction z is connected to the first intermediate portion 533. The first lower portion 532 is inclined relative to the bottom surface 52. One end of the first intermediate portion 533 in the thickness direction z is connected to the first upper portion 531, and the other end thereof in the thickness direction z is connected to the first lower portion 532. The in-plane directions of the first intermediate portion 533 are the thickness direction z and the second direction y. As viewed in the thickness direction z, the first intermediate portion 533 is located more outward than the top surface 51 and the bottom surface 52. The exposed portions 222 of the two lead portions 22 and the exposed portions 32 of the terminal leads 3 are exposed from the first intermediate portions 533 of the pair of first side surfaces 53.

As shown in FIGS. 3 and 4, the pair of second side surfaces 54 are connected to the top surface 51 and the bottom surface 52, and are spaced apart from each other in the second direction y. As shown in FIG. 1, the two island leads 2 and the terminal leads 3 are located away from the pair of second side surfaces 54.

As shown in FIGS. 3 and 4, each of the pair of second side surfaces 54 includes a second upper portion 541, a second lower portion 542, and a second intermediate portion 543. One end of the second upper portion 541 in the thickness direction z is connected to the top surface 51, and the other end thereof in the thickness direction z is connected to the second intermediate portion 543. The second upper portion 541 is inclined relative to the top surface 51. One end of the second lower portion 542 in the thickness direction z is connected to the bottom surface 52, and the other end thereof in the thickness direction z is connected to the second intermediate portion 543. The second lower portion 542 is inclined relative to the bottom surface 52. One end of the second intermediate portion 543 in the thickness direction z is connected to the second upper portion 541, and the other end thereof in the thickness direction z is connected to the second lower portion 542. The in-plane directions of the second intermediate portion 543 are the thickness direction z and the second direction y. As viewed in the thickness direction z, the second intermediate portion 543 is located more outward than the top surface 51 and the bottom surface 52.

A motor driver circuit for an inverter is typically configured with a half-bridge circuit including a low-side (low-potential-side) switching element and a high-side (high-potential-side) switching element. The following description is provided with an assumption that these switching elements are MOSFETs. Note that the reference potential of the source of the low-side switching element and the reference potential of the gate driver for driving the low-side switching element are both ground. On the other hand, the reference potential of the source of the high-side switching element and the reference potential of the gate driver for driving the high-side switching element both correspond to a potential at an output node of the half-bridge circuit. Because the potential at the output node varies according to the drive of the high-side switching element and the low-side switching element, the reference potential of the gate driver for driving the high-side switching element varies as well. When the high-side switching element is on, the reference potential is equivalent to the voltage applied to the drain of the high-side switching element (e.g., 600 V or higher). In the semiconductor device A1, the ground of the first semiconductor element 11 is spaced apart from the ground of the second semiconductor element 13. Accordingly, in the case where the semiconductor device A1 is used as the gate driver for driving the high-side switching element, a voltage equivalent to the voltage applied to the drain of the high-side switching element is transiently applied to the ground of the second semiconductor element 13.

Next, a semiconductor device A11, which is a first variation of the semiconductor device A1, will be described with reference to FIG. 15.

Figure 15:
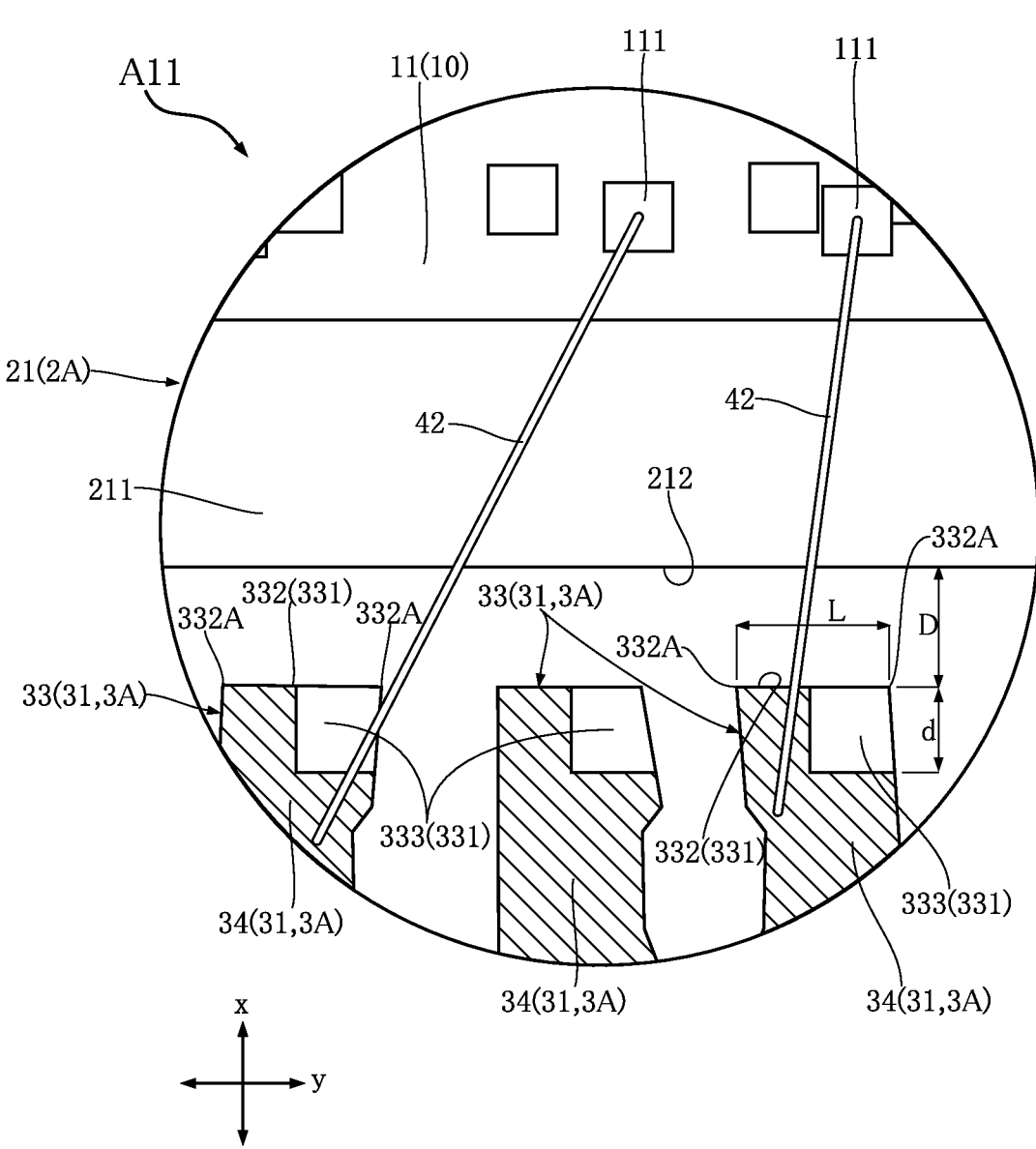
FIG. 15 is a partially enlarged plan view of a first variation of the semiconductor device in FIG. 1.

As shown in FIG. 15, the semiconductor device A11 is different from the semiconductor device A1 in the configuration of the first portion 333 of the base member 33 in each of the terminal leads 3. In the semiconductor device A11, the first portion 333 does not include the entirety of the opposing side 332, and includes one of the two ends 332A of the opposing side 332.

Next, a semiconductor device A12, which is a second variation of the semiconductor device A1, will be described with reference to FIG. 16.

Figure 16:
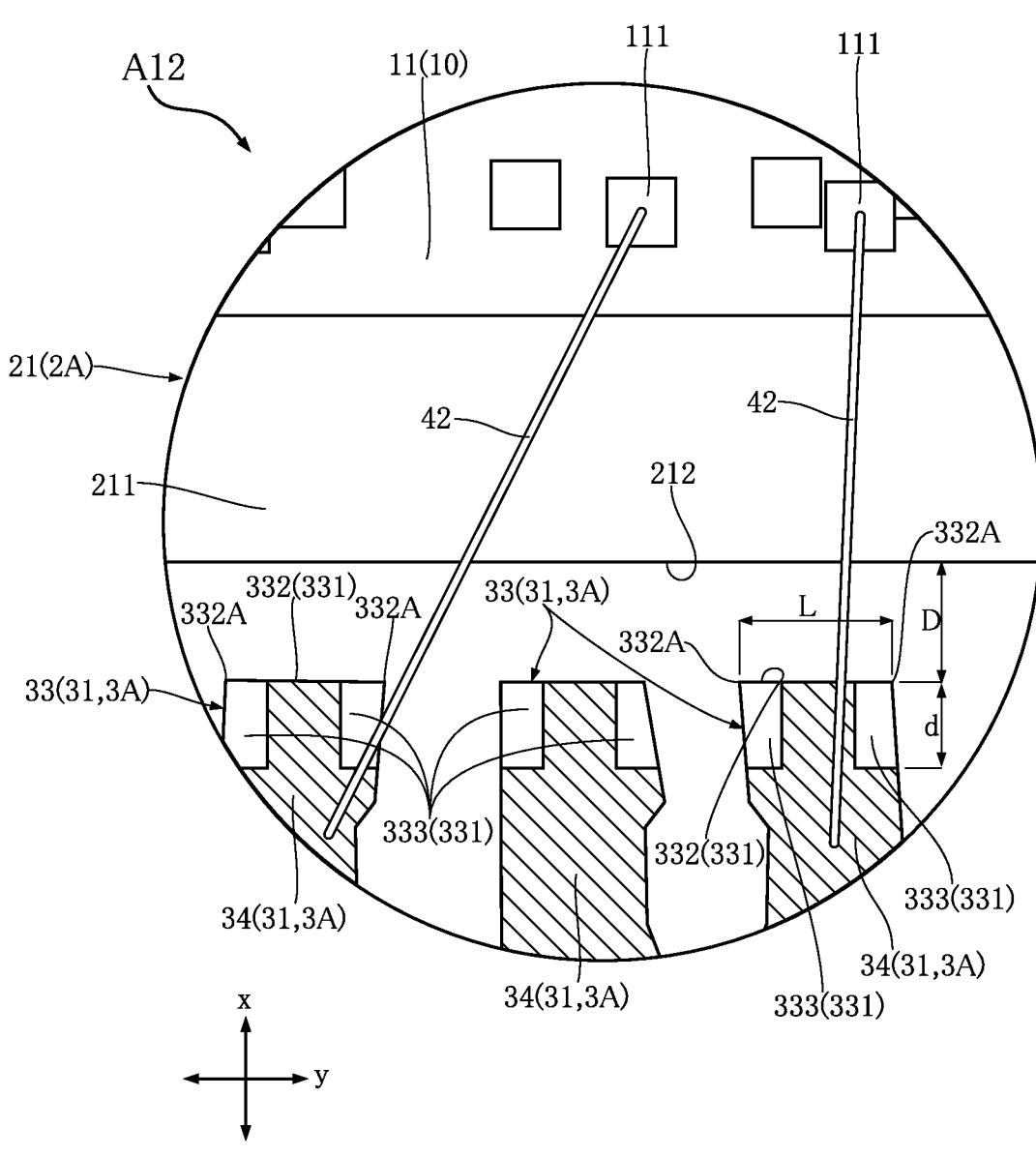
FIG. 16 is a partially enlarged plan view of a second variation of the semiconductor device in FIG. 1.

As shown in FIG. 16, the semiconductor device A12 is different from the semiconductor device A1 in the configuration of the first portion 333 of the base member 33 in each of the terminal leads 3. In the semiconductor device A12, the first portion 333 does not include the entirety of the opposing side 332, and includes the two ends 332A of the opposing side 332. As such, the first portion 333 includes a plurality of regions that are spaced apart from each other in the direction in which the opposing side 332 extends.

Next, a semiconductor device A13, which is a third variation of the semiconductor device A1, will be described with reference to FIG. 17.

Figure 17:
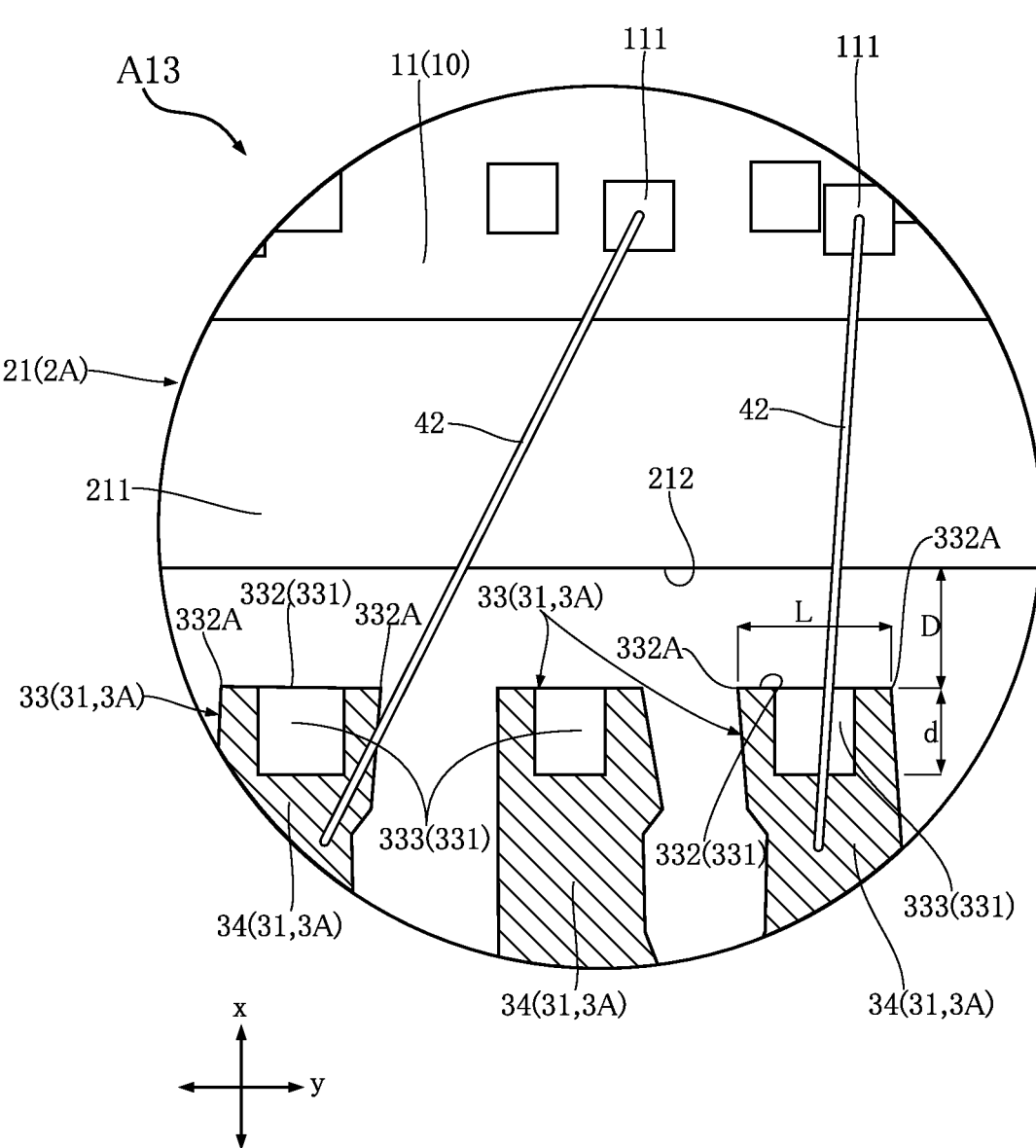
FIG. 17 is a partially enlarged plan view of a third variation of the semiconductor device in FIG. 1.

As shown in FIG. 17, the semiconductor device A13 is different from the semiconductor device A1 in the configuration of the first portion 333 of the base member 33 in each of the terminal leads 3. In the semiconductor device A13, the first portion 333 includes neither the entirety of the opposing side 332 nor the two ends 332A of the opposing side 332.

The following describes advantages of the semiconductor device A1.

The semiconductor device A1 has the terminal leads 3 electrically connected to the semiconductor elements 10, and the sealing resin 5 covering a portion of each of the terminal leads 3. Each of the terminal leads 3 includes a base member 33 having an obverse surface 331, and a metal layer 34 located between the obverse surface 331 and a wire (one of the second wires 42 and the fourth wires 44). The base member 33 has a greater bonding strength with respect to the sealing resin 5 than the metal layer 34. The obverse surface 331 includes the opposing side 332 facing one of the island leads 2, and the first portion 333 including at least a portion of the opposing side 332 and exposed from the metal layer 34. As a result, the metal layer 34 and the first portion 333 of the terminal lead 3 are in contact with the sealing resin 5. Furthermore, the bonding strength between the terminal lead 3 and the sealing resin 5 increases at the first portion 333, i.e., the tip of the terminal lead 3 located closest to the island lead 2. Accordingly, the semiconductor device A1 can suppress peeling that occurs at the interface between the terminal leads 3 and the sealing resin 5.

When a tensile force acts on one of the terminal leads 3 in a direction (the first direction x in the case of the semiconductor device A1) in which the terminal lead 3 is pulled out from the sealing resin 5, a tensile stress acting on the interface between the terminal lead 3 and the sealing resin 5 concentrates at the two ends 332A of the opposing side 332 of the base member 33. Thus, if the first portion 333 of the base member 33 includes at least one of the two ends 332A of the opposing side 332, peeling at the interface between the terminal lead 3 and the sealing resin 5 can be suppressed effectively.

It is preferable that the composition of the base member 33 include copper. This further improves the bonding strength between the first portion 333 and the sealing resin 5. It is preferable that the composition of the metal layer 34 include silver. This effectively mitigates a thermal shock acting on the base member 33 when a wire is connected to the terminal lead 3. Furthermore, if the composition of the wire includes gold, the thermal shock can be mitigated more effectively.

As viewed in the thickness direction z, the distance d (see FIGS. 7 to 14) between the metal layer 34 and the opposing side 332 is preferably 0.03 to 1.0 times the thickness t (see FIGS. 8 and 12) of the base member 33. This makes it possible to suppress an increase in the tensile stress occurring in the base member 33 when the terminal lead 3 is pulled out from the sealing resin 5 and to suppress an increase in the volume of the terminal lead 3, while increasing the bonding strength between the terminal lead 3 and the sealing resin 5.

As viewed in the thickness direction z, the distance d between the metal layer 34 and the opposing side 332 is 0.25 to 5.0 times the length L (see FIGS. 7, 9 to 11, 13, and 14) of the opposing side 332. This increases the bonding strength between the terminal lead 3 and the sealing resin 5 while maintaining the size of the terminal lead 3.

As viewed in the thickness direction z, the distance d between the metal layer 34 and the opposing side 332 is 0.02 to 0.25 times the distance D (see FIGS. 7 to 14) between the opposing side 332 and the island lead 2. This makes it possible to increase the bonding strength between the terminal lead 3 and the sealing resin 5 while preventing a decrease in the dielectric strength between the island lead 2 and the terminal lead 3 due to, for example, voids created in the sealing resin 5, and preventing an increase in the size of the semiconductor device A1.

As viewed in the thickness direction z, a wire overlaps with the first portion 333. This effectively prevents the wire from peeling off from the terminal lead 3 due to the tensile stress occurring at the interface between the terminal lead 3 and the sealing resin 5.

In the semiconductor device A1, a portion of each of the island leads 2 and the terminal leads 3 is exposed from one of the pair of first side surfaces 53 of the sealing resin 5. In this case, the island leads 2 and the terminal leads 3 are located away from the pair of second side surfaces 54 of the sealing resin 5. As such, in the semiconductor device A1, no metal members such as island supports are exposed from the pair of second side surfaces 54. This improves the dielectric strength of the semiconductor device A1.

In the semiconductor device A1, the first island 2A, which is one of the two island leads 2, has a relatively large island portion 21, and the through holes 23 are formed in the island portion 21 of the first island 2A. As the area of the island portion 21 increases, voids are more likely to be created in the sealing resin 5. Since the configuration of the present disclosure can prevent insufficient filling of the sealing resin 5 when the sealing resin 5 is injected into the mold during the formation of the sealing resin 5, voids in the sealing resin 5 can be suppressed effectively.

Figure 18:
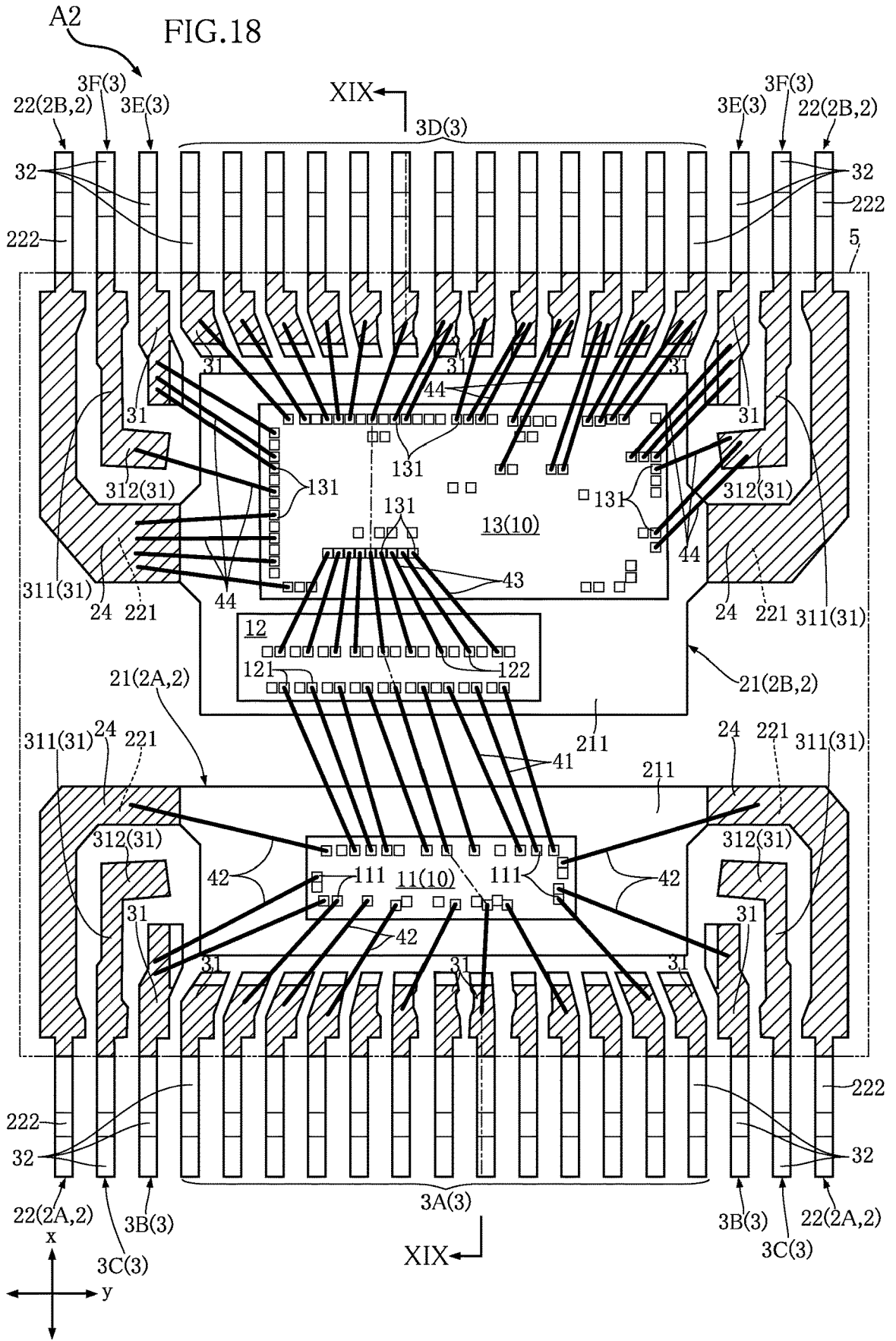
FIG. 18 is a plan view illustrating a semiconductor device according to a second embodiment of the present disclosure, as seen through a sealing resin.
Figure 19:
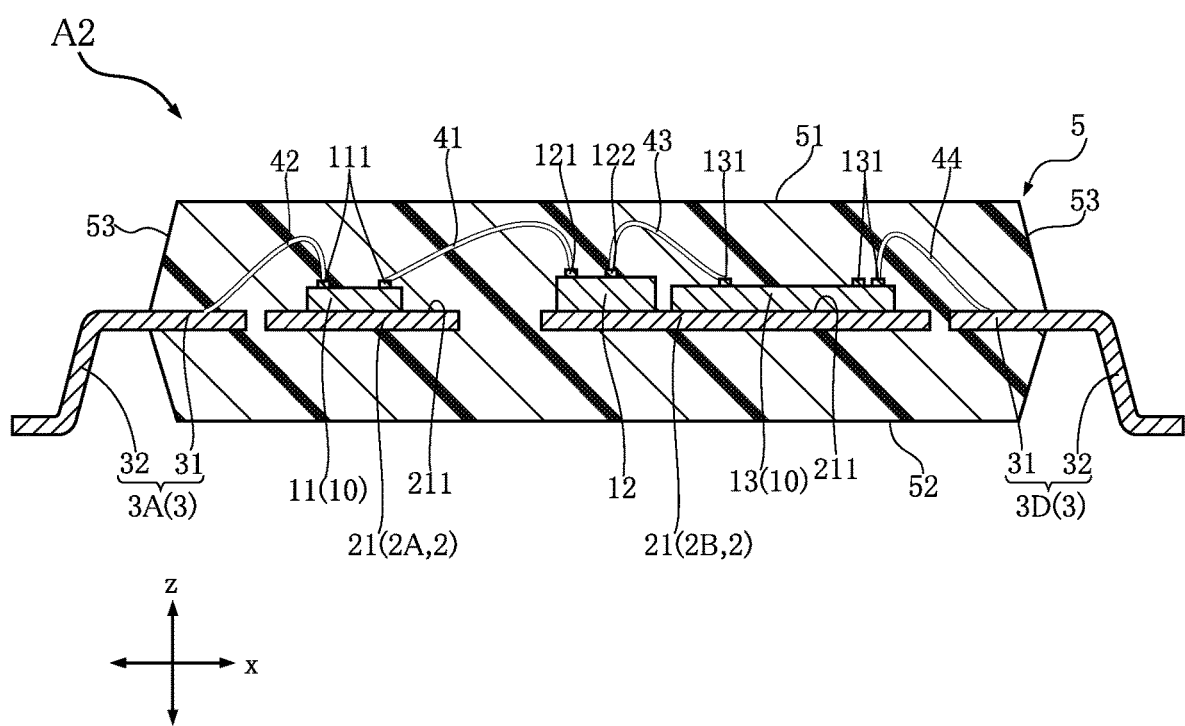
FIG. 19 is a cross-sectional view taken along line XIX-XIX in FIG. 18.

The following describes a semiconductor device A2 according to a second embodiment of the present disclosure, with reference to FIGS. 18 and 19. In these figures, elements that are the same as or similar to the elements of the semiconductor device A1 described above are provided with the same reference signs, and descriptions thereof are omitted. In FIG. 18, the sealing resin 5 is shown in phantom for convenience of understanding, and is indicated by an imaginary line.

The semiconductor device A2 is different from the semiconductor device A1 in the mounting configuration of the insulating element 12.

As shown in FIGS. 18 and 19, the insulating element 12 is mounted on the mounting surface 211 of the island portion 21 of the second island 2B. Accordingly, in the semiconductor device A2, the first wires 41 bridge the island portion 21 of the first island 2A and the island portion 21 of the second island 2B. In this way, the insulating element 12 can be mounted on an island portion 21 regardless of the relative magnitude of the potential applied to the island portion 21.

The following describes advantages of the semiconductor device A2.

The semiconductor device A2 has the terminal leads 3 electrically connected to the semiconductor elements 10, and the sealing resin 5 covering a portion of each of the terminal leads 3. Each of the terminal leads 3 includes a base member 33 having an obverse surface 331, and a metal layer 34 located between the obverse surface 331 and a wire (one of the second wires 42 and the fourth wires 44). The base member 33 has a greater bonding strength with respect to the sealing resin 5 than the metal layer 34. The obverse surface 331 includes the opposing side 332 facing one of the island leads 2, and the first portion 333 including at least a portion of the opposing side 332 and exposed from the metal layer 34. Accordingly, the semiconductor device A2 can also suppress peeling that occurs at the interface between the terminal leads 3 and the sealing resin 5. Furthermore, the semiconductor device A2 adopts a configuration common to the semiconductor device A1, and thereby achieves advantages similar to those achieved by the semiconductor device A1.

The present disclosure is not limited to the foregoing embodiments. Various design changes can be made to the specific configurations of the elements of the present disclosure.

The present disclosure includes embodiments described in the following clauses.

Clause 1.

A semiconductor device comprising:
a semiconductor element;
an island lead on which the semiconductor element is mounted;
a terminal lead electrically connected to the semiconductor element;
a wire connected to the semiconductor element and the terminal lead; and
a sealing resin covering at least a portion of each of the semiconductor element, the island lead, the terminal lead and the wire,
wherein the terminal lead includes a base member having an obverse surface facing in a thickness direction of the terminal lead, and a metal layer located between the obverse surface and the wire,
the base member has a greater bonding strength with respect to the sealing resin than the metal layer,
the obverse surface includes an opposing side facing the island lead, and
the obverse surface includes a first portion that includes at least a portion of the opposing side and that is exposed from the metal layer.

Clause 2.

The semiconductor device according to clause 1, wherein the first portion includes an end of the opposing side.

Clause 3.

The semiconductor device according to clause 1, wherein the first portion includes an entirety of the opposing side.

Clause 4.

The semiconductor device according to any of clauses 1 to 3, wherein the opposing side is linear.

Clause 5.

The semiconductor device according to any of clauses 1 to 4, wherein as viewed in the thickness direction, a distance between the metal layer and the opposing side is 0.03 to 1.0 times a thickness of the base member.

Clause 6.

The semiconductor device according to any of clauses 1 to 5, wherein as viewed in the thickness direction, the distance between the metal layer and the opposing side is 0.25 to 5.0 times a length of the opposing side.

Clause 7.

The semiconductor device according to any of clauses 1 to 6, wherein as viewed in the thickness direction, the distance between the metal layer and the opposing side is 0.02 to 0.5 times a distance between the opposing side and the island lead.

Clause 8.

The semiconductor device according to any of clauses 1 to 7, wherein the base member contains copper.

Clause 9.

The semiconductor device according to any of clauses 1 to 8, wherein the metal layer contains silver.

Clause 10.

The semiconductor device according to any of clauses 1 to 9, wherein the wire contains one of gold and copper.

Clause 11.

The semiconductor device according to any of clauses 1 to 10, wherein the island lead has a first side perpendicular to the thickness direction, and the terminal lead faces an end of the first side.

Clause 12.

The semiconductor device according to clause 11, further comprising an additional terminal lead facing the first side.

Clause 13.

The semiconductor device according to any of clauses 1 to 12, wherein as viewed in the thickness direction, the wire overlaps with the opposing side.

Clause 14.

The semiconductor device according to any of clauses 1 to 13, wherein as viewed in the thickness direction, the wire overlaps with the first portion.

Clause 15.

The semiconductor device according to any of clauses 1 to 14, wherein the semiconductor element is a gate driver.

Clause 16.

The semiconductor device according to any of clauses 1 to 14, wherein the semiconductor element is a controller.

Clause 17.

The semiconductor device according to clause 15 or 16, further comprising an inductive insulating element that is electrically connected to the semiconductor element.

REFERENCE SIGNS

| | |
|---|---|
| A1, A2: Semiconductor device | 10: Semiconductor element |
| 11: First semiconductor element | 111: Electrode |
| (Controller) | 121: First electrode |
| 12: Insulating element | 13: Second semiconductor |
| 122: Second electrode | element (Gate driver) |
| 131: Electrode | 2: Island lead |
| 2A: First island | 2B: Second island |
| 21: Island portion | 211: Mounting surface |
| 212: First side | 22: Lead portion |
| 221: Covered portion | 222: Exposed portion |
| 23: Through hole | 24: Metal layer |
| 3: Terminal lead | 3A: First terminal |
| 3B: Second terminal | 3C: Third terminal |
| 3D: Fourth terminal | 3E: Fifth terminal |
| 3F: Sixth terminal | 31: Covered portion |
| 311: Base | 312: Extended portion |
| 32: Exposed portion | 33: Base member |
| 331: Obverse surface | 332: Opposing side |
| 332A: Opposing side | 333: First portion |
| 34: Metal layer | 41: First wire |
| 42: Second wire | 43: Third wire |
| 44: Fourth wire | 5: Sealing resin |
| 51: Top surface | 52: Bottom surface |
| 53: First side surface | 531: First upper portion |
| 532: First lower portion | 533: First intermediate portion |
| 54: Second side surface | 541: Second upper portion |
| 542: Second lower portion | 543: Second intermediate portion |
| d, D: Distance | L: Length |
| t: Thickness | z: Thickness direction |
| x: First direction | y: Second direction |

The invention claimed is:

1. A semiconductor device comprising:

a semiconductor element configured as one of a gate driver for driving a switching element or a controller for the gate driver;

an island lead on which the semiconductor element is mounted;

a terminal lead electrically connected to the semiconductor element;

a wire connected to the semiconductor element and the terminal lead; and a sealing resin covering at least a portion of each of the semiconductor element, the island lead, the terminal lead and the wire, wherein the terminal lead includes a base member having an obverse surface facing in a thickness direction of the terminal lead, and a metal layer located between the obverse surface and the wire, the base member has a greater bonding strength with respect to the sealing resin than the metal layer, the obverse surface includes an opposing side facing the island lead, the opposing side having a first end and a second end that are opposite from each other, the obverse surface includes a first portion that includes at least a portion of the opposing side and that is exposed from the metal layer, and the first portion is formed by one of a first configuration, a second configuration, and a third configuration, wherein the first configuration includes only a part of the opposing side and only one of the first end and the second end, the second configuration includes only a part of the opposing side and both of the first end and the second end, and the third configuration includes only a part of the opposing side and none of the first end and the second end.

2. The semiconductor device according to claim 1, wherein the opposing side is linear.

3. The semiconductor device according to claim 1, wherein as viewed in the thickness direction, a distance between the metal layer and the opposing side is 0.03 to 1.0 times a thickness of the base member.

4. The semiconductor device according to claim 1, wherein as viewed in the thickness direction, the distance between the metal layer and the opposing side is 0.25 to 5.0 times a length of the opposing side.

5. The semiconductor device according to claim 1, wherein as viewed in the thickness direction, the distance between the metal layer and the opposing side is 0.02 to 0.25 times a distance between the opposing side and the island lead.

6. The semiconductor device according to claim 1, wherein the base member contains copper.

7. The semiconductor device according to claim 1, wherein the metal layer contains silver.

8. The semiconductor device according to claim 1, wherein the wire contains one of gold and copper.

9. The semiconductor device according to claim 1, wherein the island lead has a first side perpendicular to the thickness direction, and the terminal lead faces an end of the first side.

10. The semiconductor device according to claim 9, further comprising an additional terminal lead facing the first side.

11. The semiconductor device according to claim 1, wherein as viewed in the thickness direction, the wire overlaps with the opposing side.

12. The semiconductor device according to claim 1, wherein as viewed in the thickness direction, the wire overlaps with the first portion.

13. The semiconductor device according to claim 1, further comprising an inductive insulating element that is electrically connected to the semiconductor element.

14. A semiconductor device comprising:

a semiconductor element;

an island lead on which the semiconductor element is mounted;

a terminal lead electrically connected to the semiconductor element;

a wire connected to the semiconductor element and the terminal lead; and a sealing resin covering at least a portion of each of the semiconductor element, the island lead, the terminal lead and the wire, wherein the terminal lead includes a base member having an obverse surface facing in a thickness direction of the terminal lead, and a metal layer located between the obverse surface and the wire, the base member has a greater bonding strength with respect to the sealing resin than the metal layer, the obverse surface includes an opposing side facing the island lead, the obverse surface includes a first portion that includes at least a portion of the opposing side and that is exposed from the metal layer, as viewed in the thickness direction, a distance between the metal layer and the opposing side is 0.03 to 1.0 times a thickness of the base member.

15. The semiconductor device according to claim 14, wherein as viewed in the thickness direction, the distance between the metal layer and the opposing side is 0.25 to 5.0 times a length of the opposing side.

16. The semiconductor device according to claim 14, wherein as viewed in the thickness direction, the distance between the metal layer and the opposing side is 0.02 to 0.25 times a distance between the opposing side and the island lead.

\* \* \* \* \*